(12) United States Patent
Inoue et al.

(10) Patent No.: US 7,742,351 B2
(45) Date of Patent: Jun. 22, 2010

(54) SEMICONDUCTOR DEVICE AND ELECTRONIC DEVICE

(75) Inventors: Takayuki Inoue, Kanagawa (JP);
Yoshiyuki Kurokawa, Kanagawa (JP);
Takayuki Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/762,146

(22) Filed: Jun. 13, 2007

(65) Prior Publication Data

US 2008/0002454 A1    Jan. 3, 2008

(30) Foreign Application Priority Data

Jun. 30, 2006    (JP)    ............... 2006-181212

(51) Int. Cl.
    *G11C 7/00*    (2006.01)
(52) U.S. Cl. ............. 365/203; 365/189.05; 365/230.06
(58) Field of Classification Search ................ 365/203, 365/189.05, 189.07, 189.09, 189.11, 205, 365/230.06
    See application file for complete search history.

(56) References Cited

U.S. PATENT DOCUMENTS

| | | | | |
|---|---|---|---|---|
| 5,754,485 A | * | 5/1998 | Miura | ............... 365/203 |
| 5,761,123 A | * | 6/1998 | Kim et al. | ............ 365/185.21 |
| 5,892,713 A | * | 4/1999 | Jyouno et al. | ......... 365/185.11 |
| 6,028,812 A | * | 2/2000 | Tanaka | .................. 365/230.03 |
| 6,097,638 A | * | 8/2000 | Himeno et al. | ........ 365/185.25 |
| 6,480,419 B2 | * | 11/2002 | Lee | ...................... 365/185.18 |
| 6,600,672 B2 | * | 7/2003 | Hayashi | .................... 365/104 |
| 7,130,234 B2 | | 10/2006 | Shionoiri et al. | |
| 7,193,912 B2 | * | 3/2007 | Obara et al. | ............... 365/203 |

FOREIGN PATENT DOCUMENTS

JP    08-017195    1/1996

OTHER PUBLICATIONS

Hiroki Dembo et al,: "RFCPUs on Glass and Plastic Substrates fabricated by TFT Transfer Technology"; *IEEE, Technical Digest of International Electron Devices Meeting*; pp. 1067-1069; Dec. 5, 2005.

* cited by examiner

*Primary Examiner*—Gene N. Auduong
(74) *Attorney, Agent, or Firm*—Fish & Richardson P.C.

(57) ABSTRACT

In relation to reading of data in a memory, it is an object to provide a semiconductor device mounted with a low power consumption memory. A semiconductor device including a word line, a bit line, and a memory cell electrically connected to the word line and the bit line, further includes a precharge circuit for making the bit line have an electric potential for reading data stored in the memory cell. The precharge circuit is provided for each bit line and connected to the bit line. Further, the precharge circuit is capable of making each bit line have an electric potential for reading the data stored in the memory cell for each bit line.

20 Claims, 21 Drawing Sheets

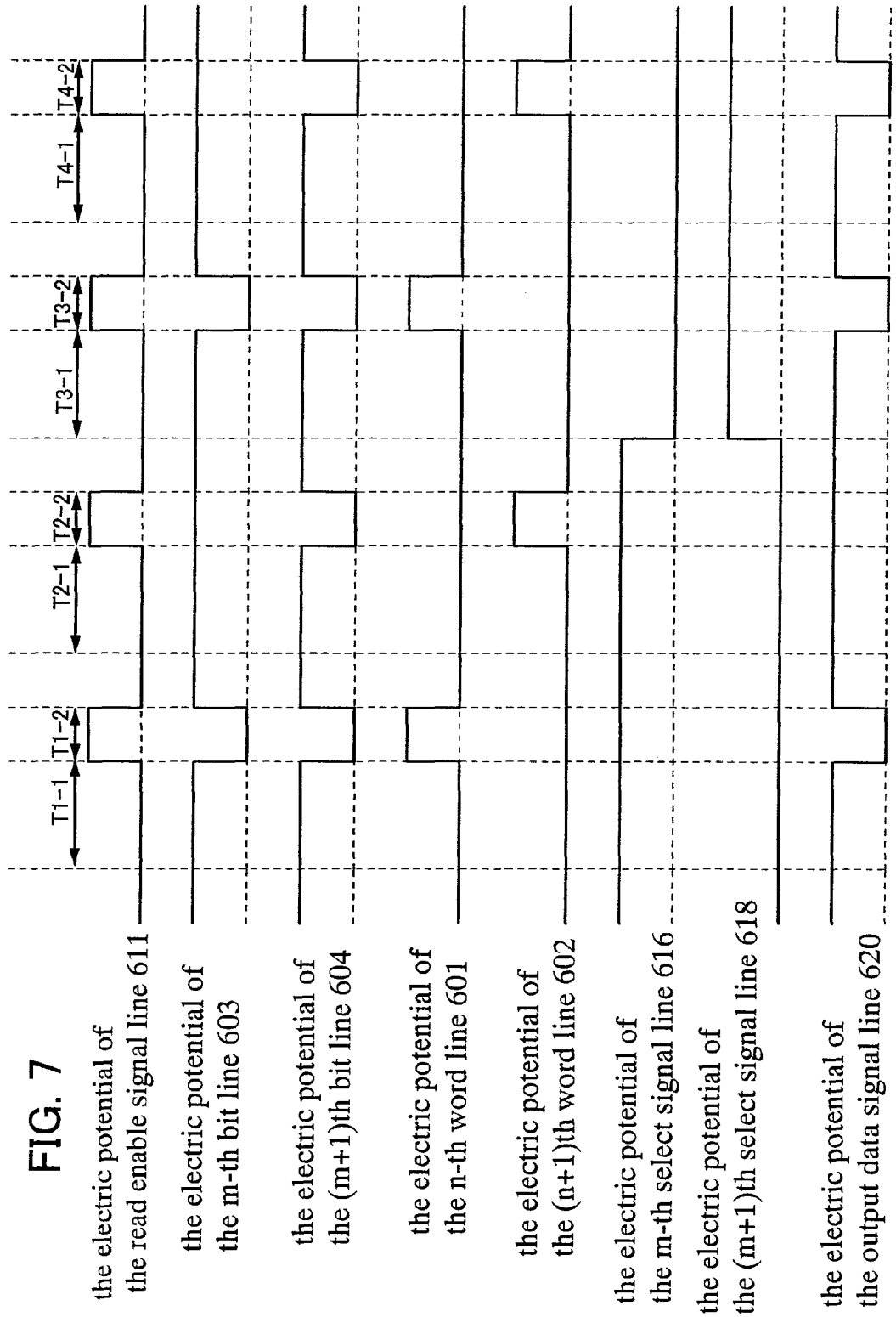

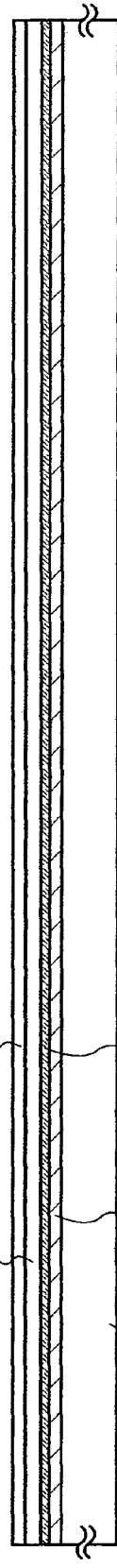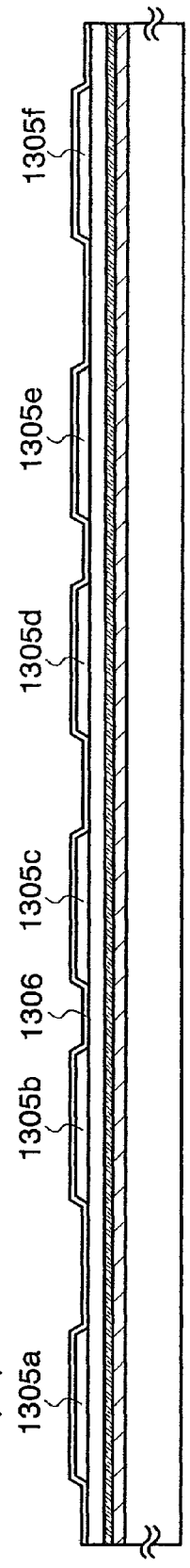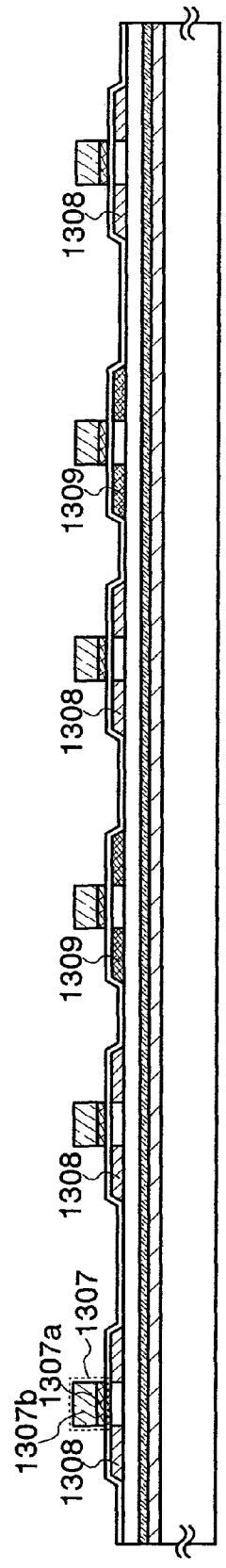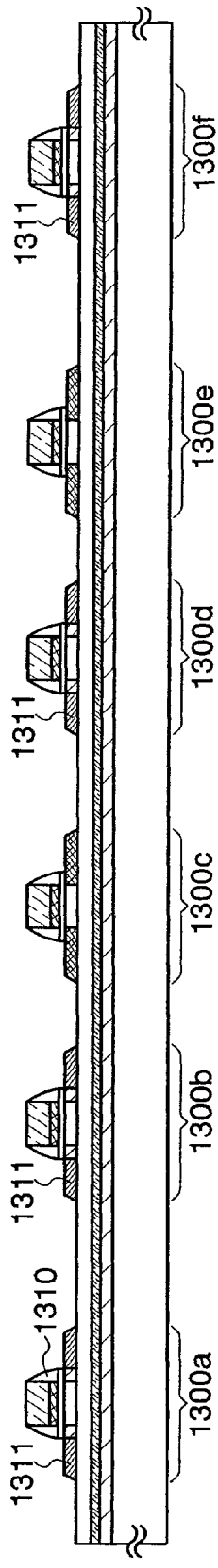

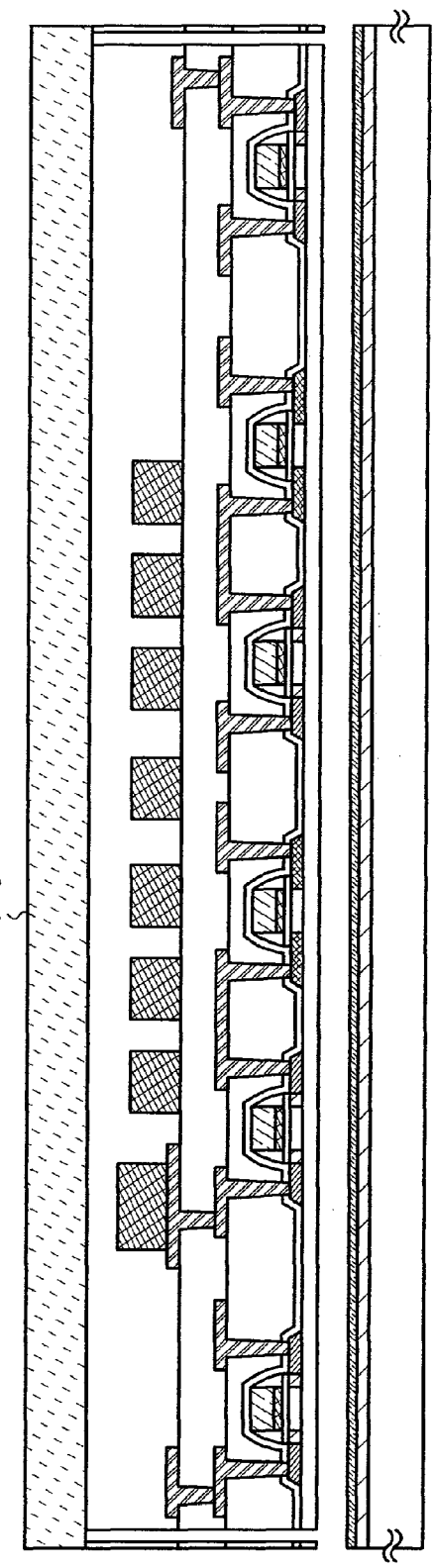
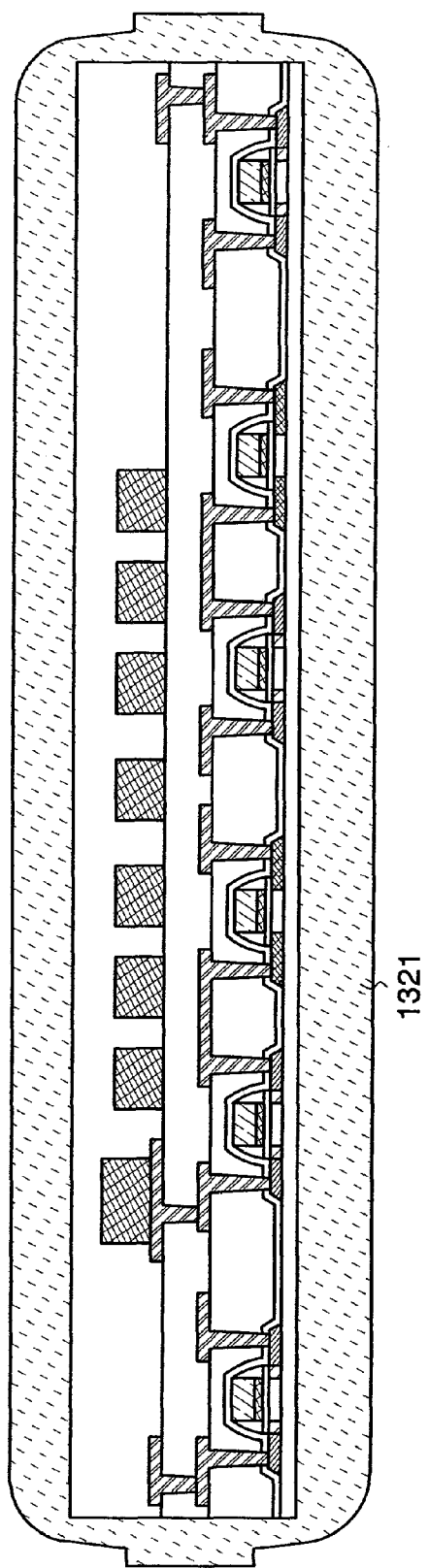
FIG. 13(A)
FIG. 13(B)

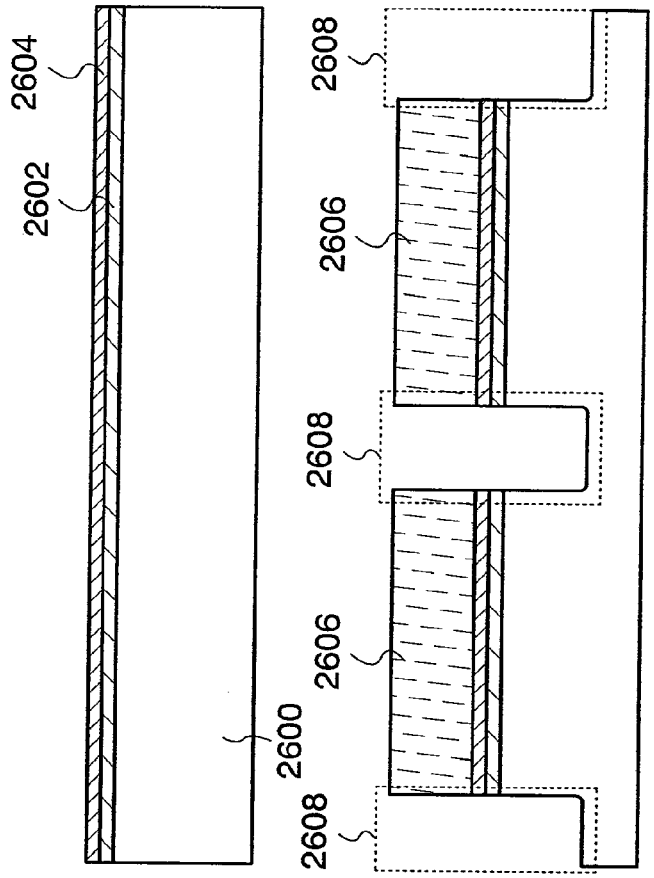
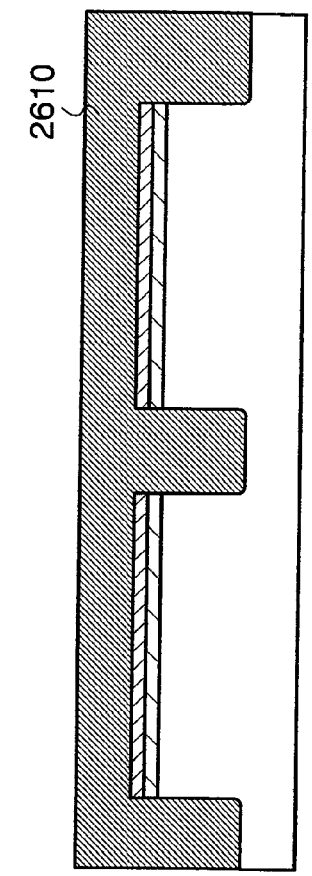
FIG. 17(A)
FIG. 17(B)
FIG. 17(C)

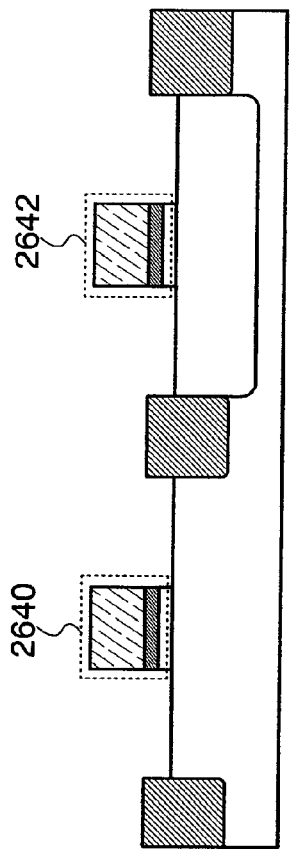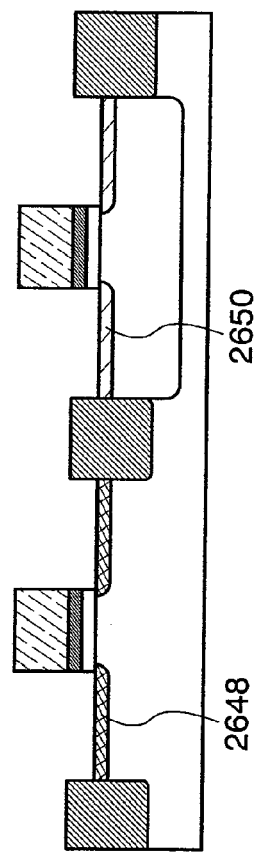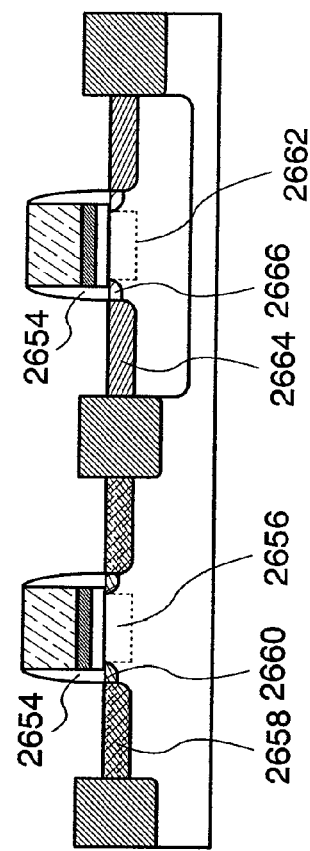

3000

3000

3000

3000

3000

3000

SEMICONDUCTOR DEVICE AND ELECTRONIC DEVICE

BACKGROUND OF THE INVENTION

1. Field of the Invention

The present invention relates to semiconductor devices. In particular, the present invention relates to semiconductor devices each mounted with a memory. Further, the present invention relates to electronic devices mounted with the semiconductor devices

2. Description of the Related Art

Regarding a semiconductor device mounted with a memory, the performance of the memory is extremely important because the performance of the semiconductor device depends on it. For example, as to a semiconductor device mounted with a CPU and a memory, commands to be processed by the CPU and data necessary for the processing need to be stored in the memory. Further, processing by the CPU is progressed by sequential reading of the data in the memory. In other words, as to a semiconductor device mounted with a CPU and a memory, in order to achieve higher performance, the CPU needs to be able to handle more complicated processes, and this requires a high-capacity memory. Furthermore, as for a semiconductor device mounted with a memory, the power consumption of the memory accounts for much of the power consumption of the semiconductor device, in many cases.

In Reference 1 (Hiroki Dembo, et al. "RFCPUs on Glass and Plastic Substrates fabricated by TFT Transfer Technology" IEEE, TECHNICAL DIGEST OF INTERNATIONAL ELECTRON DEVICES MEETING, Dec. 5, 2005, pp. 1067-1069), which one of the present inventors co-wrote, an RFID (Radio Frequency Identification) device (hereinafter referred to as RFID) mounted with a CPU (Central Processing Unit) and a memory is disclosed as an example of a semiconductor device mounted with a memory. For such an RFID, performance of achieving both increase in memory capacity and reduction in power consumption, which is difficult to be achieved, is required in order to achieve higher performance.

SUMMARY OF THE INVENTION

As to semiconductor devices mounted with memories, increase in power consumption involved in reading of data has become significant associated with increase in memory capacity in recent years. In particular, as to ROM (Read Only Memory) of which data is read at high speed, when stored data is read, it is required to precharge bit lines. Accordingly, when data of ROM is read, power consumption has particularly increased significantly.

Here, an example of ROM in a conventional memory, where data is read will be explained using the structure of a mask ROM shown in FIG. 5. Note that FIG. 5 shows a block diagram of the mask ROM. Further, FIG. 6 is a circuit diagram of the present invention in which a region 511 in FIG. 5 is enlarged. Further, FIG. 7 is a timing chart with respect to the circuit diagram of the mask ROM in FIG. 6.

First, FIG. 5 will be explained. A mask ROM in FIG. 5 includes address signal lines 501, an address input buffer 502, a row decoder 503, a ground line 504 (also referred to as a GND line), a memory matrix 505, a read enable signal line 506, a precharge circuit 507, a column decoder 508, a data output buffer 509, and data signal lines 510.

In FIG. 5, explanation will be made assuming that the address signal lines 501 include ten address signal lines A0 to A9. Further, explanation will be made assuming that the memory matrix 505 includes a plurality of memory cells. Further, explanation will be made assuming that the data signal lines 510 include eight data signal lines D0 to D7. Note that the number of the address signal lines 501 and the number of the data signal lines 510 mentioned here are only examples, and the numbers are not limited thereto.

Next, the structure of the region 511 in FIG. 5 will be explained with reference to FIG. 6. As the region 511 in FIG. 5, an n-th (n is an integer) word line 601, an (n+1)th word line 602, an m-th (m is an integer) bit line 603, an (m+1)th bit line 604, a memory cell 605 of n-th row and m-th column, which is arranged corresponding to the intersection of the n-th word line 601 and the m-th bit line 603, a memory cell 606 of (n+1)th row and m-th column, which is arranged corresponding to the intersection of the (n+1)th word line 602 and the m-th bit line 603, a memory cell 607 of n-th row and (m+1)th column, which is arranged corresponding to the intersection of the n-th word line 601 and the (m+1)th bit line 604, a memory cell 608 of (n+1)th row and (m+1)th column, which is arranged corresponding to the intersection of the (n+1)th word line 602 and the (m+1)th bit line 604, an m-th precharge circuit 609, an (m+1)th precharge circuit 610, and a read enable signal line 611, an m-th latch circuit 612, an (m+1)th latch circuit 613, an m-th analog switch 614, an (m+1)th analog switch 615, an m-th select signal line 616, an m-th inverted select signal line 617, an (m+1)th select signal line 618, an (m+1)th inverted select signal line 619, and an output data signal line 620 of the memory are shown.

Note that in this specification, a memory cell arranged corresponding to the intersection of an n-th word line and an m-th bit line is referred to as a memory cell of n-th row and m-th column.

The memory cell 605 of n-th row and m-th column, the memory cell 606 of (n+1)th row and m-th column, the memory cell 607 of n-th row and (m+1)th column, and the memory cell 608 of (n+1)th row and (m+1)th column are each formed from one N-channel transistor. Here, in the memory cell 605 of n-th row and m-th column, the gate of the N-channel transistor is electrically connected to the n-th word line 601, the source to the ground line, and the drain to the m-th bit line 603, respectively. In the memory cell 606 of (n+1)th row and m-th column, the gate of the N-channel transistor is electrically connected to the (n+1)th word line 602, the drain to the m-th bit line 603, and the source is not electrically connected to be in a floated state. In the memory cell 607 of the n-th row and (m+1)th column, the gate of the N-channel transistor is electrically connected the n-th word line 601, the source to the ground line, the drain to the (m+1)th bit line 604, respectively. In the memory cell 608 of (n+1)th row and (m+1)th column, the gate of the N-channel transistor is electrically connected to the (n+1)th word line 602, the source to the ground line, and the drain to the (m+1)th bit line 604, respectively. Further, the m-th precharge circuit 609 and the (m+1)th precharge circuit 610 are each formed from a P-channel transistor. The gate of the P-channel transistor of the m-th precharge circuit 609 is electrically connected to the read enable signal line 611, the source to a power line 621, the drain to the m-th bit line 603, respectively. The gate of the P-channel transistor of the (m+1)th precharge circuit 610 is electrically connected to the read enable signal line 611, the source to a power line 622, the drain to the (m+1)th bit line 604, respectively.

Both the m-th select signal line 616 and the m-th inverted select signal line 617 is electrically connected to the m-th analog switch 614. Note that the electric potential of the m-th select signal line 616 is a high electric potential level (hereinafter referred to as H level), and the electric potential of the m-th inverted select signal line 617 is a low electric potential level (hereinafter referred to as L level); thus, the m-th analog switch 614 can be made to be electrically conducting or non-conducting. Both the (m+1)th select signal line 618 and the (m+1)th inverted select signal line 619 is electrically connected to the (m+1)th analog switch 615. Note that the electric potential of the (m+1)th select signal line 618 is set at H level, and the electric potential of the (m+1)th inverted select signal line 619 is set at L level; thus, the (m+1)th analog switch 615 can be electrically conducting or non-conducting. Note that the electric potentials of the m-th select signal line 616 and the electric potential of the (m+1)th select signal line 618 are generated by decoding of certain bits of memory address signals. Accordingly, one of them is set at H level, and the other is set at L level. Further, when the electric potential of the m-th select signal line 616 is set at L level, the electric potential of the m-th inverted select signal line 617 is set at H level, and when the electric potential of the m-th select signal line 616 is set at H level, the electric potential of the m-th inverted select signal line 617 is set at L level. Similarly, when the electric potential of the (m+1)th select signal line 618 is set at L level, the electric potential of the (m+1)th inverted select signal line 619 is set at H level, and when the electric potential of the (m+1)th select signal line 618 is set at H level, the electric potential of the (m+1)th inverted select signal line 619 L level.

Next, a timing chart of signals inputted to and outputted to the memory cells shown in FIG. 6 will be described with reference to FIG. 7. FIG. 7 is a timing chart of the electric potential of the read enable signal line 611, the electric potential of the m-th bit line 603, the electric potential of the (m+1)th bit line 604, the electric potential of the n-th word line 601, the electric potential of the (n+1)th word line 602, the electric potential of the m-th select signal line 616, the electric potential of the (m+1)th select signal line 618, and the electric potential of the output data signal line 620.

Further, in FIG. 7, T1-1 is a first precharge period, T1-2 is a first reading period, T2-1 is a second precharge period, T2-2 is a second reading period, T3-1 is a third precharge period, T3-2 is a third reading period, T4-1 is a fourth precharge period, and T4-2 is a fourth reading period.

Note that in this specification, a specific example of inputting H level or L level to each signal line is shown; however, the electric potential of each signal line is not limited thereto because it depends on the polarity of the transistors included in a circuit.

Next, operation of the memory shown in FIG. 6 will be described in details with reference to the timing chart of FIG. 7. First, the case of reading data in the memory cell 605 of n-th row and m-th column will be explained.

First, in the first precharge period T1-1, the electric potential of the read enable signal line 611 supplied to the read enable signal line 611 is set at L level. Here, the electric potentials of the gates of the P-channel transistors of the m-th precharge circuit 609 and (m+1)th precharge circuit 610 are at L level. Therefore, the electric potentials of the m-th bit line 603 and the (m+1)th bit line 604 become H level.

Further, the electric potentials of both the n-th word line 601 and (n+1)th word line 602 are set at L level. In addition, in order to read data in the memory cell 605 of n-th row and m-th column, the electric potential of the m-th select signal line 616 is set at H level, and the electric potential of the (m+1)th select signal line 618 is set at L level. Accordingly, the m-th analog switch 614 is conducting, and the (m+1)th analog switch 615 is not conducting.

Note that the electric potentials of the m-th bit line 603 and the (m+1)th bit line 604 are held in the m-th latch circuit 612 and the (m+1)th latch circuit 613, respectively. Thus, H level is held. The above is precharge operation during the m-th precharge period T1-1.

Next, in the first reading period T1-2, the electric potential of the read enable signal line 611 is made to be H level. In that case, the electric potentials of the gates of the P-channel transistors of the m-th precharge circuit 609 and (m+1)th precharge circuit 610 are to be H level.

Further, in order to read data in the memory cell 605 of n-th row and m-th column, the electric potential of the n-th word line 601 is set at H level. In that case, the electric potentials of the gates of the N-channel transistors of the memory cell 605 of n-th row and m-th column and the memory cell 607 of n-th row and (m+1)th column are to be H level.

At that time, the source of the N-channel transistor in the memory cell 605 of n-th row and m-th column is electrically connected to the ground; therefore, the electric potential of the bit line 603 of n-th row and m-th column becomes L level. Similarly, the source of the N-channel transistor in the memory cell 607 of n-th row and (m+1)th column is electrically connected to the ground; therefore, the electric potential of the (m+1)th bit line 604 becomes L level.

Here, since the m-th analog switch 614 is conducting, the electric potential of the output data signal line 620 becomes L level as with the electric potential of the m-th bit line 603. Thus, data of the memory cell 605 of n-th row and m-th column is read. The above is the explanation about operation of reading data in the memory cell 605 of n-th row and m-th column.

Next, the case of reading data in the memory cell 606 of (n+1)th row and m-th column will be explained.

First, in the second precharge period T2-1, the electric potential of the read enable signal line 611 supplied to the read enable signal line 611 is set at L level. Here, the electric potentials of the gates of the P-channel transistors of the m-th precharge circuit 609 and (m+1)th precharge circuit 610 are at L level. Therefore, the electric potentials of the m-th bit line 603 and the (m+1)th bit line 604 become H level.

Further, the electric potentials of both the n-th word line 601 and (n+1)th word line 602 are set at L level. In addition, in order to read data in the memory cell 606 of (n+1)th row and m-th column, the electric potential of the m-th select signal line 616 is set at H level, and the electric potential of the (m+1)th select signal line 618 is set at L level. Accordingly, the m-th analog switch 614 is conducting, and the (m+1)th analog switch 615 is not conducting.

Note that here, the electric potentials of the m-th bit line 603 and the (m+1)th bit line 604 are held in the m-th latch circuit 612 and the (m+1)th latch circuit 613, respectively. Thus, H level is held. The above shows precharge operation during the second precharge period T2-1.

Next, in the second reading period T2-2, the electric potential of the read enable signal line 611 is made to be H level. In that case, the electric potentials of the gates of the P-channel transistors of the m-th precharge circuit 609 and (m+1)th precharge circuit 610 are to be H level.

Further, in order to read data in the memory cell 606 of (n+1)th row and m-th column, the electric potential of the (n+1)th word line 602 is set at H level. In that case, the electric potentials of the gates of the N-channel transistors of the memory cell 606 of (n+1)th row and m-th column and the memory cell 608 of n-th row and (m+1)th column are to be H level.

At that time, the source of the N-channel transistor in the memory cell 606 of (n+1)th row and m-th column is not connected; therefore, the electric potential of the m-th bit line 603 becomes H level. On the other hand, the source of the N-channel transistor in the memory cell 608 of (n+1)th row and (m+1)th column is electrically connected to the ground; therefore, the electric potential of the (m+1)th bit line 604 becomes L level.

Here, since the m-th analog switch 614 is conducting, the electric potential of the output data signal line 620 becomes H level as with the electric potential of the m-th bit line 603. Thus, data of the memory cell 606 of (n+1)th row and m-th column is read. The above is the explanation about operation of reading data in the memory cell 606 of n-th row and m-th column.

After that, the precharge operation is similarly carried out in a third precharge period T3-1, and data in the memory cell 607 of n-th row and (m+1)th column is to be read during the third precharge period T3-2. Similarly, precharge operation is carried out in a fourth precharge period T4-1, and data of the memory cell 608 of (n+1)th row and (m+1)th column is to be read in the fourth reading period T4-2.

The above is explanation about operation of the memory shown in FIG. 6.

As shown in a timing chart of FIG. 7, in conventional operation of reading data in a memory, the electric potential of a bit line is H level in a precharge period; thus, variation in the electric potential increases, and a large amount of power is to be consumed. Further, in conventional operation of reading data in a memory, the electric potential of a bit line is set at L level in the reading period; thus, when the electric potential is L level, variation in the electric potential increases, and a large amount of power is to be consumed.

For example, a memory cell of which data is to be read in the second reading period T2-2 in FIG. 7 is the memory cell 606 of (n+1)th row and m-th column; however, the electric potential of the (m+1)th bit line 604 connected to the memory cell 608 of (n+1)th row and (m+1)th column is also L level at the same time. Thus, it is seen that power is consumed also in a bit line which is not to be read.

The present invention was made in view of the above problems and relates to reading of data in a memory and it is an object of the present invention to provide a semiconductor device mounted with a low power consumption memory.

In a semiconductor device mounted with a memory of the present invention, a bit line connected to a memory cell storing data to be read is selectively precharged. Further, the electric potential of a bit line connected to a memory cell which is not to be read is not precharged. In a detailed structure of the invention, an analog switch is provided so that the electric potentials of a bit line and a data line in a memory are selectively precharged. The detailed structure of the present invention will be described below.

A semiconductor device of the present invention includes a word line, a first bit line and a second bit line, a first memory cell electrically connected to the word line and the first bit line, a second memory cell electrically connected to the word line and the second bit line, a first precharge circuit which outputs an electric potential for reading data stored in the first memory cell to a first bit line, a second precharge circuit which outputs an electric potential for reading data stored in the second memory cell to a second bit line, a first switching element provided between the first bit line and the first precharge circuit, and a second switching element provided between the second bit line and the second precharge circuit. An electric potential for reading data stored in the first memory cell is inputted to the first bit line, which is selected by the first switching element. An electric potential for reading data stored in the second memory cell is inputted to the second bit line, which is selected by the second switching element.

A semiconductor device of the present invention includes a word line, a first bit line and a second bit line, a first memory cell electrically connected to the word line and the first bit line, a second memory cell electrically connected to the word line and the second bit line, a precharge circuit which outputs an electric potential for reading data stored in the memory cell to a bit line selected from the first bit line or the second bit line, a first switching element provided between the first bit line and the precharge circuit, and a second switching element provided between the second bit line and the precharge circuit. An electric potential for reading data stored in the first memory cell is inputted to one of the first bit line, which is selected by the first switching element. An electric potential for reading data stored in the second memory cell is inputted to the second bit line, which is selected by the second switching element.

Further, in the present invention, a memory cell includes a transistor; and a gate terminal of the transistor may be connected to a word line; and one terminal of a source and a drain may be connected to a bit line. In addition, the transistor may be provided over one substrate, and the substrate may be any one of a glass substrate, a quartz substrate, and a plastic substrate. Further, the transistor may have an SOI substrate.

Further, in the present invention, a latch circuit storing an electric potential for reading data stored in a memory cell bit line, which is electrically connected to a bit line may be included.

Further, in the present invention, a precharge circuit includes a transistor, and one terminal of a source and a drain of the transistor may be electrically connected to a switching element.

Further, in the present invention, a decoder for selecting one of memory cells and reading stored data is included, and the decoder may be connected to the memory cell through a word line and a bit line.

A switch used in the present invention may be any switch such as an electrical switch or a mechanical switch. That is, various types of switches can be used as long as they can control a current, without being limited to a particular type. It may be a transistor, a diode (PN diode, PIN diode, Schottky diode, diode-connected transistor, and the like), or a logic circuit configured by combining them. Therefore, in the case of applying a transistor as a switch, polarity (conductivity) of the transistor is not particularly limited because it operates just as a switch. However, when off-current is preferred to be small, a transistor of polarity with a small off current is favorably used. For example, there is given a transistor having an LDD region, a transistor having a multigate structure and the like as a transistor with a small off current. Further, it is desirable that an N-channel transistor is employed when a potential of a source terminal of the transistor serving as a switch is closer to the low potential side power source (Vss, GND, 0 V and the like), and a P-channel transistor is desirably employed when the potential of the source terminal is closer to the high potential side power source (Vdd and the like). This helps a transistor to operate stably as a switch as the absolute value of the gate-source voltage can be increased. It is also to be noted that a CMOS switch can also be applied by using both N-channel and P-channel transistors. With a CMOS switch, an operation can be appropriately performed even when the situation changes such that a voltage output through the switch (that is, an input voltage to the switch) is higher or lower than an output voltage.

In the present invention, "being connected" means "being electrically connected" and "being directly connected". Therefore, in the configuration disclosed in the present invention, another element which enables an electrical connection (for example, a switch, a transistor, a capacitor element, an inductor, a resistor element, a diode, and the like) may be provided in addition to the predetermined connection. Alternatively, direct connection may be made without interposing another element. It is to be noted that when elements are connected without interposing another element which enables electrical connection and connected not electrically but directly, it is referred to as "being directly connected" or "being in direct connection". It is to be noted when the description is made as "being electrically connected", it includes a case where elements are electrically connected and a case where elements are directly connected.

It is to be noted that transistors of various modes can be applied as a transistor of the present invention. Therefore, kinds of transistors applicable to the present invention are not limited. Accordingly, a thin film transistor (TFT) using an amorphous semiconductor film typified by amorphous silicon and polycrystalline silicon, a transistor formed using a semiconductor substrate or an SOI substrate, a MOS transistor, a junction transistor or a bipolar transistor, a transistor using a compound semiconductor such as ZnO or a-InGaZnO, a transistor using an organic semiconductor or a carbon nanotube, and other transistors can be used. It is to be noted that an amorphous semiconductor film may contain hydrogen or halogen. A substrate over which a transistor is provided is not limited to a particular type and various kinds of substrates can be used. Therefore, a transistor can be provided over, for example, a single crystalline substrate, an SOI substrate, a glass substrate, a quartz substrate, a plastic substrate, a paper substrate, a cellophane substrate, a stone material substrate, a stainless steel substrate, a substrate including a stainless steel foil and the like. Further, a transistor formed using a certain substrate may be transferred to another substrate.

It is to be noted that a transistor can have structures with various modes and is not limited to a specific structure. For example, a multigate structure which has two or more gate lines may be employed as well. With a multigate structure, off-current can be reduced, and reliability can be improved by improving the pressure resistance of a transistor. Further, flat characteristics can be obtained such that a drain-source current hardly changes even when a drain-source voltage changes in the operation in a saturation region. Further, gate electrodes may be provided over and under a channel. Accordingly, a channel region increases with such a structure in which gate electrodes are provided over and under a channel, thereby an S value (sub-threshold coefficient) can be reduced since a current value is increased and a depletion layer is easily formed. Further, a gate electrode may be provided over a channel or under the channel. A staggered structure or an inversely staggered structure may be employed. A channel region may be divided into a plurality of regions, connected in parallel, or connected in series. Further, a source electrode or a drain electrode may overlap a channel (or a part of it). Unstable operation due to accumulation of charges in a part of the channel can be prevented by employing such a structure in which a source electrode or a drain electrode does not overlap a channel (or a part of it). Further, an LDD region may be provided. By providing an LDD region, off-current can be reduced and reliability can be improved by improving the pressure resistance of a transistor. Further, flat characteristics can be obtained such that a drain-source current hardly changes even when a drain-source voltage changes in the operation in a saturation region.

A transistor is an element with at least three terminals, having a gate, a drain, and a source. A channel region is provided between the drain region and the source region.

Here, it is difficult to determine which of two terminals is a source or a drain since they depend on the structure, operating condition, and the like of the transistor. Therefore, in the present invention, there is a case where a region which functions as a source or a drain is not referred to a source or a drain. In that case, as one example, the source or the drain is referred to as a first terminal or a second terminal.

It is to be noted that a gate includes a gate electrode and a gate wire (also referred to as a gate line) or a part of them. A gate electrode corresponds to a conductive film of a part overlapping a semiconductor forming a channel region or an LDD (Lightly Doped Drain) region and the like with a gate insulating film interposed therebetween.

It is to be noted that a source includes a source region, a source electrode, and a source wire (also referred to as source line, source signal line, or the like), or a part of them. A source region corresponds to a semiconductor region which contains a large amount of P-type impurities (boron, gallium, or the like) or N-type impurities (phosphorus, arsenic, or the like). Therefore, a region containing a small amount of P-type impurities or N-type impurities, that is, an LDD (Lightly Doped Drain) region is not included in a source region. A source electrode corresponds to a conductive layer of a part which is formed of a different material from a source region and electrically connected to the source region. However, a source electrode is sometimes referred to as a source electrode including a source region. A source wire corresponds to a wire for connecting between source electrodes of pixels or a wire for connecting a source electrode and another wire.

However, there is a region which functions as a source electrode and also as a source wire. Such a region may be referred to as a source electrode or a source wire. That is, there is a region which cannot be distinguished as a source electrode or a source wire. For example, when there is a source region overlapping a source wire which is extended, the region functions as a source wire and also as a source electrode. Therefore, such a region may be referred to as a source electrode or a source wire.

Further, a region which is formed of the same material as a source electrode and connected to a source electrode may be referred to as a source electrode as well. A part which connects one source electrode and another source electrode may also be referred to as a source electrode as well. Further, a part overlapping a source region may be referred to as a source electrode. Similarly, a part which is formed of the same material as a source wire and connected to the source wire may be referred to as a source wire. In a strict sense, there is a case where such a part does not have a function to connect one source electrode to another source electrode. However, there is a region which is formed of the same material as a source electrode or a source wire and connected to the source electrode or the source wire due to manufacturing efficiency and the like. Therefore, the region may also be referred to as a source electrode or a source wire.

For example, a conductive film of a portion which connects a source electrode and a source wire may be referred to as a source electrode or a source wire.

It is to be noted that a source terminal corresponds to a part of a source region, a source electrode, or a region electrically connected to a source electrode.

It is to be noted that the definition of a drain is similar to that of a source, so the description is be omitted.

In addition, in the present invention, a semiconductor device corresponds to a device including a circuit having a semiconductor element (transistor, diode, or the like). Further, a semiconductor device may be a general device which functions by utilizing semiconductor characteristics.

In the present invention, an expression that an object is "formed on" or "formed over" a different object does not necessarily mean that the object is in direct contact with a different object. The expression may include a case where two objects are not in direct contact with each other, i.e., with another object sandwiched therebetween. Accordingly, when it is described that a layer B is formed on a layer A (over a layer A), it means either case where the layer B is formed on and in direct contact with the layer A, or where another layer (e.g., a layer C or a layer D) is formed on and in direct contact with the layer A, and then the layer B is formed on and in direct contact with the layer C or D. In addition, when it is described that an object is "formed above" a different object, it does not necessarily mean that the object is in direct contact with the different object, and another object may be sandwiched therebetween. Accordingly, for example, when it is described that a layer B is formed over or above a layer A, it means either case where the layer B is formed in direct contact with the layer A, or where another layer (e.g., a layer C or a layer D) is formed in direct contact with the layer A, and then the layer B is formed in direct contact with the layer C or D. Similarly, when it is described that an object is formed below or under a different object, it means either case where the objects are in direct contact with each other or not in contact with each other.

In accordance with the present invention, regarding a semiconductor device mounted with a memory, bit lines can be selectively precharged. In other words, bit lines which are not associated with reading of data from a memory are not precharged; thus, a semiconductor device having a low power consumption memory can be obtained.

BRIEF DESCRIPTION OF DRAWINGS

FIG. 7 is a diagram showing the circuit diagram shown in FIG. 6;

FIGS. 11A to 11D are diagrams illustrating a structure of Embodiment 3 using the present invention;

FIGS. 13A and 13B are diagrams illustrating a structure of Embodiment 3 using the present invention;

FIGS. 17A to 17C are diagrams illustrating a structure of Embodiment 5 using the present invention;

FIGS. 19A to 19C are diagrams illustrating a structure of Embodiment 5 using the present invention;

DETAILED DESCRIPTION OF THE INVENTION

Embodiment Mode

Figure 1:
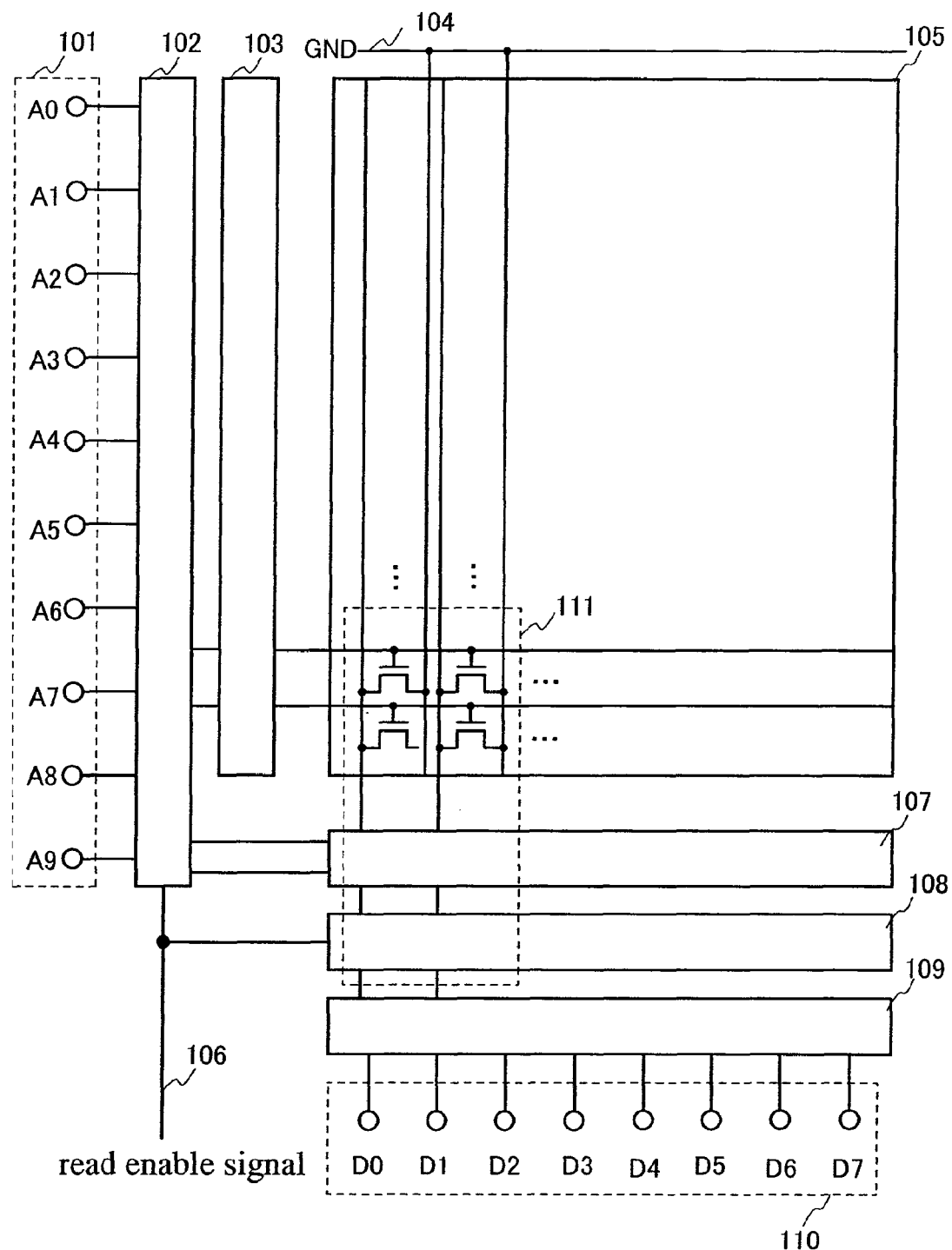
FIG. 1 is a block diagram of a mask ROM of the present invention.

Hereinafter, embodiment modes and embodiments will be described with reference to the drawings. It is to be noted that the present invention is not limited to the following description, and it is easily understood by those skilled in the art that modes and details herein disclosed can be modified in various ways without departing from the spirit and the scope of the present invention. Therefore, the present invention should not be interpreted as being limited to the description of the embodiment modes and the embodiments below. It is to be noted that the like portions or portions having the same function are denoted by the same reference numerals throughout the drawings and description thereof will not repeated.

Embodiment Mode 1

Figure 2:
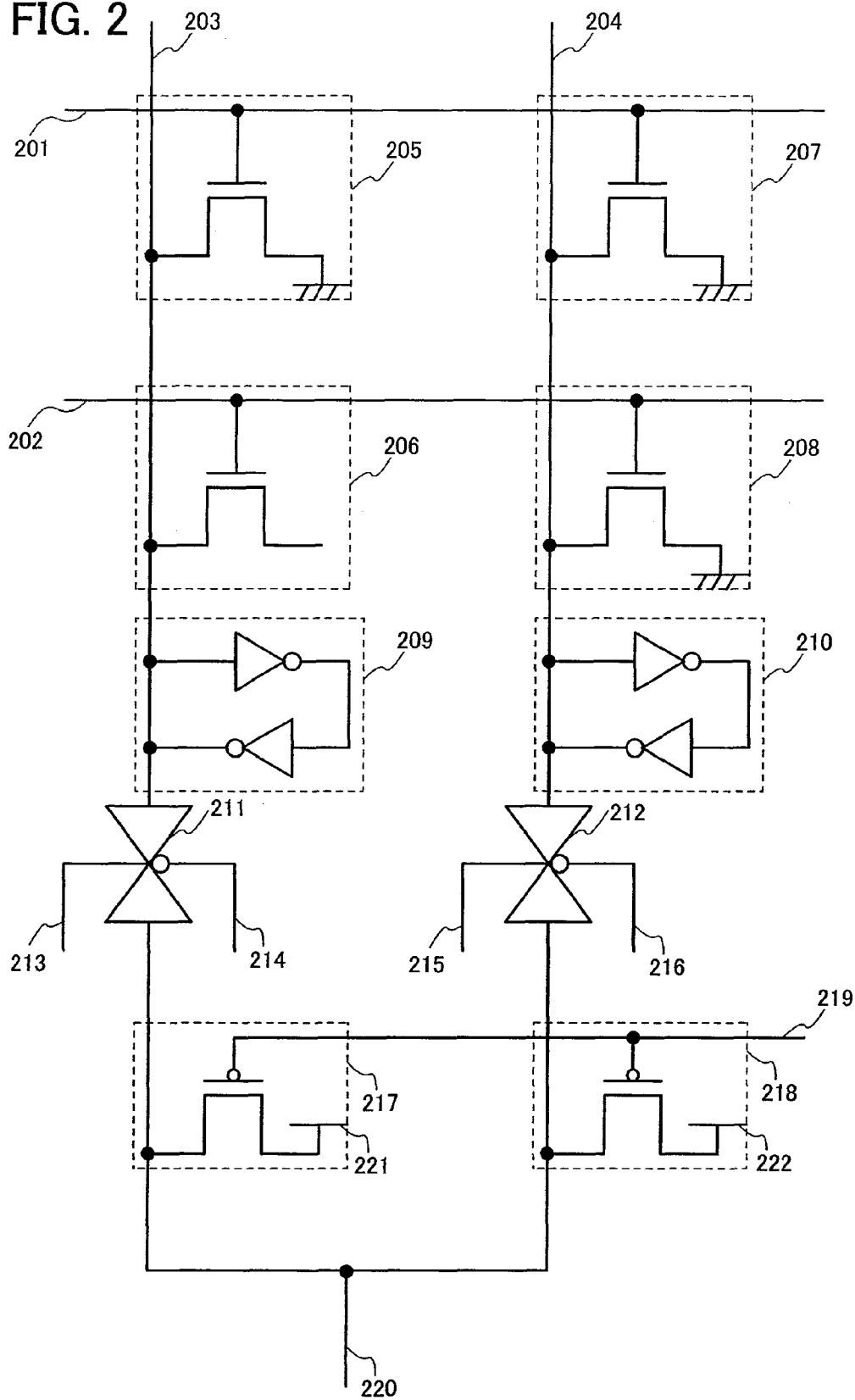
FIG. 2 is a circuit diagram showing a precharge circuit of Embodiment Mode 1.
Figure 3:
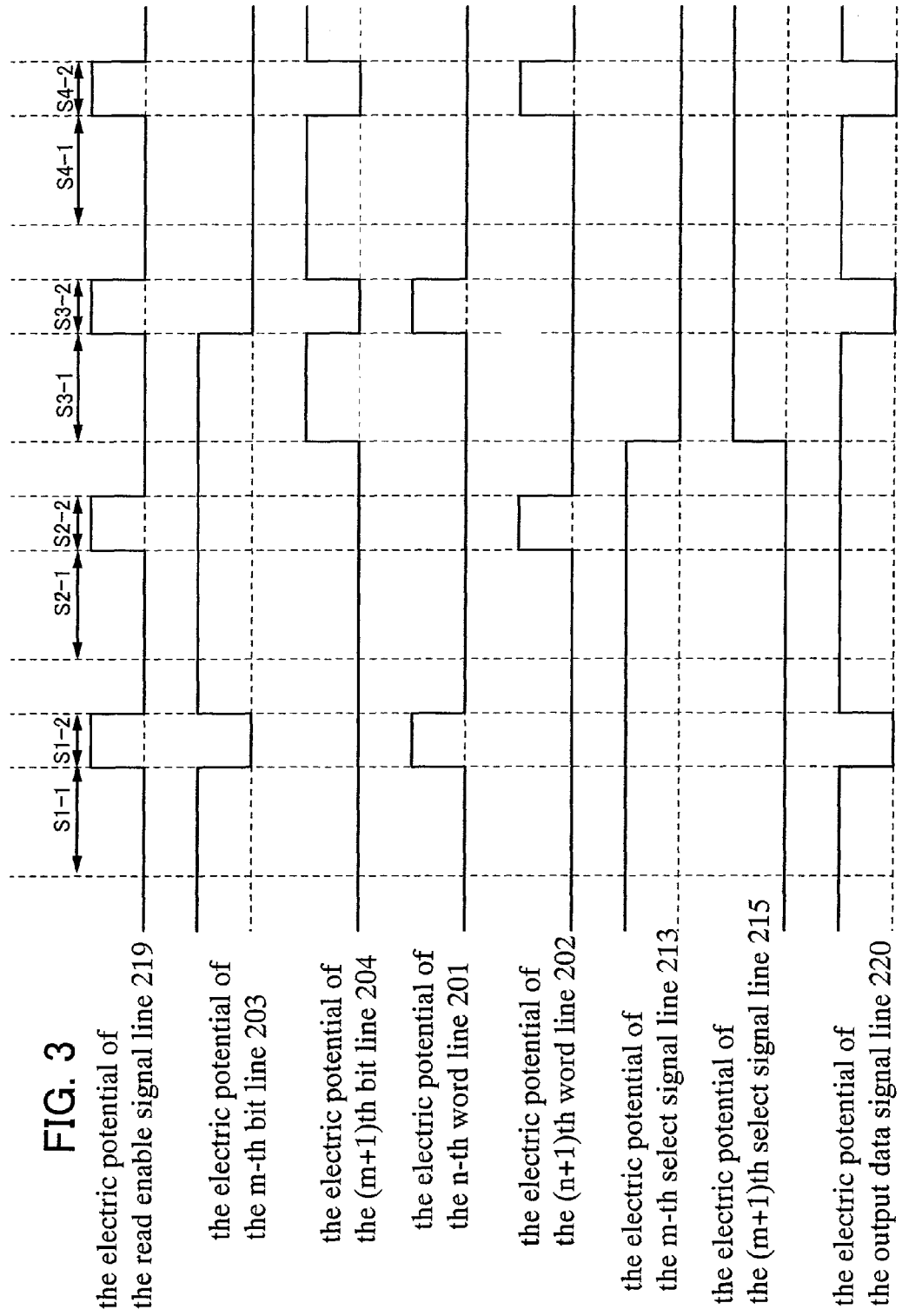
FIG. 3 is a diagram showing a timing chart of the circuit diagram shown in FIG. 2.

This embodiment mode will be described with reference to FIG. 1, FIG. 2, and FIG. 3. FIG. 1 is a block diagram of a mask ROM of the present invention. Further, FIG. 2 is a circuit diagram of the invention, in which a region 111 in FIG. 1 is enlarged. Further, FIG. 3 is a timing chart of the circuit diagram shown in FIG. 2. Note that in this embodiment mode, a memory having memory cells of two rows and two columns will be described; however, n rows and m columns can be generally used (n and m are natural numbers).

In this embodiment mode, a ROM where data is read will be described using a mask ROM as an example. In FIG. 1, the mask ROM includes address signal lines 101, an address input buffer 102, a row decoder 103, a ground line 104, a memory matrix 105, a read enable signal line 106, a switching circuit 107, a precharge circuit 108, a data output buffer 109, and data signal lines 110.

In FIG. 1, explanation will be made assuming that the address signal lines 501 include ten address signal lines A0 to A9. Further, explanation will be made assuming that the memory matrix 105 includes a plurality of memory cells. Further, explanation will be made assuming that the data signal lines 110 include eight data signal lines D0 to D7. Note that the number of the address signal lines 101 and the number of the data signal lines 110 mentioned here are only examples, and the numbers are not limited thereto.

Next, the structure of the region 111 of a mask ROM in FIG. 2 will be explained. The region 111 in FIG. 2 includes an n-th word line 201, an (n+1)th word line 202, an m-th bit line 203, an (m+1)th bit line 204, a memory cell 205 of n-th row and m-th column, which is arranged at the point where the n-th word line 201 and the m-th bit line 203 intersect, a memory cell 206 of (n+1)th row and m-th column, which is arranged at the point where the (n+1)th word line 202 and the m-th bit line 203 intersect, a memory cell 207 of n-th row and (m+1)th column, which is arranged at the point where the n-th word line 201 and the (m+1)th bit line 204 intersect, a memory cell 207 of (n+1)th row and (m+1)th column, which is arranged at the point where the (n+1)th word line 202 and the (m+1)th bit line 204 intersect, an m-th latch circuit 209, an (m+1)th latch circuit 210, an m-th analog switch 211, an (m+1)th analog switch 212, an m-th select signal line 213, an m-th inverted select signal line 214, an (m+1)th select signal line 215, an (m+1)th inverted select signal line 216, an m-th precharge circuit 217, an (m+1)th precharge circuit 218, a read enable signal line 219, and an output data signal line 220 of the memory.

Note that in this specification, a memory cell arranged corresponding to the intersection point of an n-th word line and an m-th bit line is referred to as a memory cell of n-th row and m-th column.

The memory cell 205 of n-th row and m-th column, the memory cell 206 of (n+1)th row and m-th column, the memory cell 207 of n-th row and (m+1)th column, and the memory cell 208 of (n+1)th row and (m+1)th column are each formed from one N-channel transistor. Here, in the memory cell 205 of n-th row and m-th column, the gate of the N-channel transistor is electrically connected to the n-th word line 201, the source to the ground line, and the drain to the m-th bit line 203, respectively. In the memory cell 206 of (n+1)th row and m-th column, the gate of the N-channel transistor is electrically connected to the (n+1)th word line 202, the drain to the m-th bit line 203, and the source is not electrically connected to be in a floated state. In the memory cell 207 of the n-th row and (m+1)th column, the gate of the N-channel transistor is electrically connected the n-th word line 201, the source to the ground line, the drain to the (m+1)th bit line 204, respectively. In the memory cell 208 of (n+1)th row and (m+1)th column, the gate of the N-channel transistor is electrically connected to the (n+1)th word line 202, the source to the ground line, and the drain to the (m+1)th bit line 204, respectively. Further, the m-th precharge circuit 217 and the (m+1)th precharge circuit 218 are each formed from a P-channel transistor. The gate of the P-channel transistor of the m-th precharge circuit 217 is electrically connected to the read enable signal line 219, the source to a power line 221, the drain to the output data signal line 220 of the memory, respectively. The gate of the P-channel transistor of the (m+1)th precharge circuit 218 is electrically connected to the read enable signal line 219, the source to a power line 222, and the drain to the output data signal line 220 of the memory, respectively.

Both the m-th select signal line 213 and the m-th inverted select signal line 214 are electrically connected to the m-th analog switch 211. Note that the electric potential of the m-th select signal line 213 is set at H level, and the electric potential of the m-th inverted select signal line 214 is set at L level; thus, the m-th analog switch 211 can be made to be electrically conducting or non-conducting. Both the (m+1)th select signal line 215 and the (m+1)th inverted select signal line 216 are electrically connected to the (m+1)th analog switch 211. Note that the electric potential of the (m+1)th select signal line 215 is set at H level, and the electric potential of the (m+1)th inverted select signal line 216 is set at L level; thus, the m-th analog switch 211 can be made to be electrically conducting or non-conducting. Note that the electric potential of the m-th select signal line 213 and the electric potential of the (m+1)th select signal line 215 are generated by decoding of certain bits of memory address signals. Accordingly, one of them is set at H level, and the other is set at L level. Further, when the electric potential of the m-th select signal line 213 is set at L level, the electric potential of the m-th inverted select signal line 214 is set at H level, and when the electric potential of the m-th select signal line 213 is set at H level, the electric potential of the m-th inverted select signal line 214 is set at L level. Similarly, when the electric potential of (m+1)th select signal line 215 is set at L level, the electric potential of the (m+1)th inverted select signal line 216 is set at H level, and when the electric potential of the (m+1)th select signal line 215 is set at H level, the electric potential of the (m+1)th inverted select signal line 216 is set at L level.

Further, FIG. 3 is a timing chart of the electric potential of the read enable signal line 219, the electric potential of the m-th bit line 203, the electric potential of the (m+1)th bit line 204, the electric potential of the n-th word line 201, the electric potential of the (n+1)th word line 202, the electric potential of the m-th select signal line 213, the electric potential of the (m+1)th select signal line 215, and the electric potential of the output data signal line 220 of the memory. The electric potentials correspond to the electric potentials of the read enable signal line 219, the m-th bit line 203, the (m+1)th bit line 204, the n-th word line 201, the (n+1)th word line 202, the m-th select signal line 213, the (m+1)th select signal line 215, and the output data signal line 220 of the memory, respectively, which are shown in FIG. 2.

Further, in FIG. 3, S1-1 is a first precharge period, S1-2 is a first reading period, S2-1 is a second precharge period, S2-2 is a second reading period, S3-1 is a third precharge period, S3-2 is a third reading period, S4-1 is a fourth precharge period, and S4-2 is a fourth reading period.

Next, operation of the memory shown in FIG. 2 will be described. First, the case of reading data in the memory cell 205 of n-th row and m-th column will be explained.

First, in the first precharge period S1-1, the electric potential of the read enable signal line 219 is set at L level. Here, the electric potentials of the gates of the P-channel transistors of the m-th precharge circuit 217 and (m+1)th precharge circuit 218 are at L level. Further, the electric potential of the n-th word line 201 and the electric potential of the (n+1)th word line 202 are set at L level.

Further, the electric potential of the m-th select signal line 213 is set at H level, and the electric potential of the (m+1)th select signal line 215 is set at L level. At that time, the m-th analog switch 211 is conducting, and the (m+1)th analog switch 212 is not conducting. Therefore, the electric potential of the m-th bit line 203 becomes H level.

Note that the electric potentials of the m-th bit line 203 is held in the m-th latch circuit 209. Thus, H level is held. The above is precharge operation during the first precharge period S1-1.

Next, in the first reading period S1-2, the electric potential of the read enable signal line 219 is made to be H level. In that case, the electric potentials of the gates of the P-channel transistors of the m-th precharge circuit 217 and (m+1)th precharge circuit 218 become L level.

Further, in order to read data in the memory cell 205 of n-th row and m-th column, the n-th word line 201 is set at H level. In that case, the electric potentials of the gates of the N-channel transistors of the memory cell 205 of n-th row and m-th column and the memory cell 207 of n-th row and (m+1)th column are to be H level.

At that time, the source of the N-channel transistor in the memory cell 205 of n-th row and m-th column is electrically connected to the ground; therefore, the electric potential of the m-th bit line 203 becomes L level. Similarly, the source of the N-channel transistor in the memory cell 207 of n-th row and (m+1)th column is electrically connected to the ground; therefore, the electric potential of the (m+1)th bit line 204 becomes L level.

Here, since the m-th analog switch 211 is conducting, the electric potential of the output data signal line 220 becomes L level as with the electric potential of the m-th bit line 203.

Thus, data of the memory cell 205 is to be read. The above is the explanation about operation of reading data in the memory cell 205.

Next, the case of reading data in the memory cell 206 of (n+1)th row and m-th column will be explained.

First, in the second precharge period S2-1, the electric potential of the read enable signal line 219 is set at L level. Here, the electric potentials of the gates of the P-channel transistors of the m-th precharge circuit 217 and (m+1)th precharge circuit 218 are at L level. Further, the n-th word line 201 and the (n+1)th word line 202 remain at L level.

The m-th select signal line 213 is set at H level, and the (m+1)th select signal line 215 is set at L level. At that time, the m-th analog switch 211 is conducting, and the (m+1)th analog switch 212 becomes non-conducting. Therefore, the electric potential of the m-th bit line 203 becomes H level. Further, the electric potential of the (m+1)th bit line 204 become L level.

Note that the electric potential of the m-th bit line 203 is held in the m-th latch circuit 209. Thus, H level is held. Similarly, the electric potential of the (m+1)th bit line 204 is held in the (m+1)th latch circuit 210. Thus, L level is held. The above shows precharge operation during the second precharge period S2-1.

Next, in the second reading period S2-2, the electric potential of the read enable signal line 611 is made to be H level. In that case, the electric potentials of the gates of the P-channel transistors of the m-th precharge circuit 217 and (m+1)th precharge circuit 218 are to be L level.

Further, in order to read data in the memory cell 206 of (n+1)th row and m-th column, the electric potential of the (n+1)th word line 202 is set at H level. In that case, the electric potentials of the gates of the N-channel transistors of the memory cell 206 of (n+1)th row and m-th column and the memory cell 208 of n-th row and (m+1)th column are to be H level.

At that time, the source of the N-channel transistor in the memory cell 206 of (n+1)th row and m-th column is not connected; therefore, the electric potential of the m-th bit line 203 becomes H level. On the other hand, the source of the N-channel transistor in the memory cell 208 of (n+1)th row and (m+1)th column is electrically connected to the ground; therefore, the electric potential of the (m+1)th bit line 204 becomes L level.

Here, since the m-th analog switch 211 is conducting, the electric potential of the output data signal line 220 becomes H level as with the electric potential of the m-th bit line 203. Thus, data of the memory cell 206 is read. The above is the explanation about operation of reading data in the memory cell 206 of n-th row and m-th column.

After that, the precharge operation is similarly carried out in a third precharge period S3-1, and data in the memory cell 207 of n-th row and (m+1)th column is to be read during the third precharge period S3-2. Similarly, precharge operation is carried out in a fourth precharge period S4-1, and data of the memory cell 208 of (n+1)th row and (m+1)th column is to be read in the fourth reading period S4-2.

The above is explanation about operation of the memory shown in FIG. 2.

Figure 5:
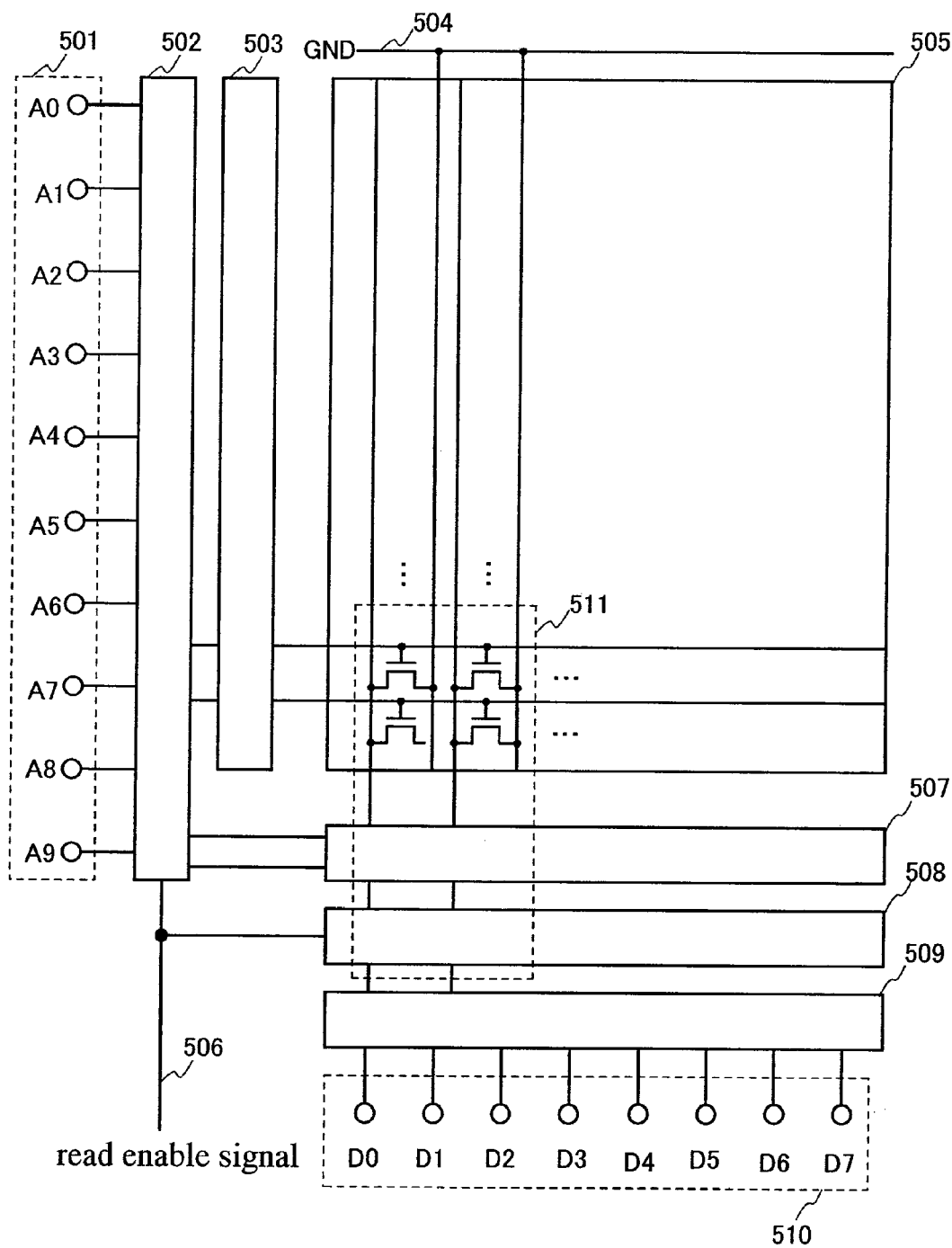
FIG. 5 is a block diagram of a conventional mask ROM.
Figure 6:
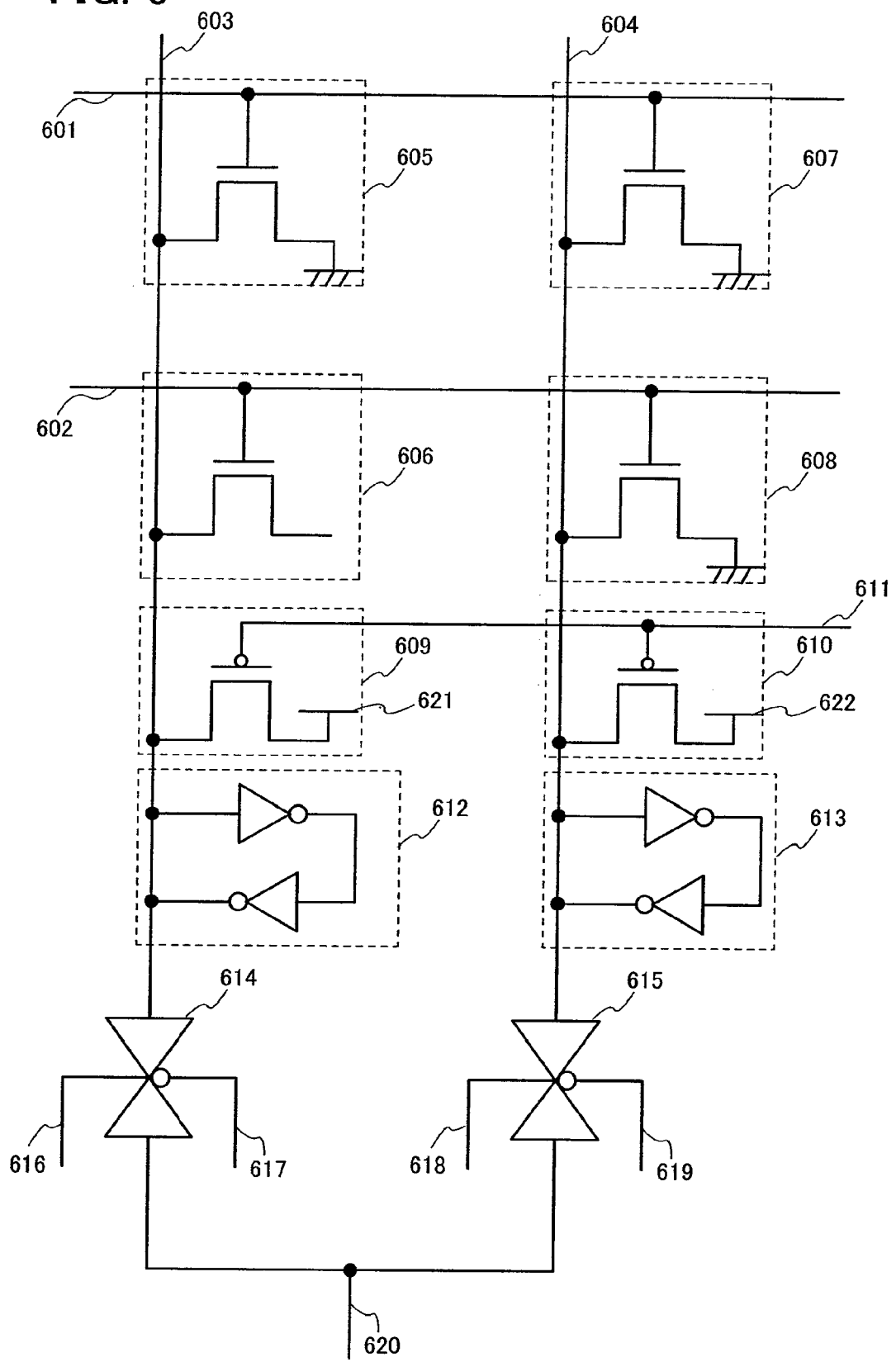
FIG. 6 is a circuit diagram of a conventional precharge circuit diagram.

Further, the structure associated with reading of data in a conventional ROM shown in FIG. 5 to FIG. 7 and the structure associated with reading of data in a ROM of the present invention will be compared to explain advantages of the present invention.

In the circuit in FIG. 6, which is a mask ROM circuit shown as a conventional example, the m-th bit line 603 is at H level twice and the (m+1)th bit line 604 is at H level four times as shown in the timing chart of FIG. 7. On the other hand, in the circuit of FIG. 2, the electric potential of the m-th bit line 203 is H level once, and the electric potential of the (m+1)th bit line 204 is at H level three times in FIG. 3. Therefore, unnecessary precharging can be prevented in the present invention. Accordingly, power consumption can be reduced. With any of the above structures, a semiconductor device having a low power consumption memory can be provided.

Note that this embodiment mode can be implemented in combination with any of other embodiment modes and other embodiments as appropriate.

Embodiment Mode 2

In this embodiment mode, a structure different from the structure described in the above Embodiment Mode 1 will be explained.

Note that a block diagram of the structure of a mask ROM of this embodiment mode is similar to the structure described in Embodiment Mode 1 with reference to FIG. 1. Therefore, in this embodiment mode, the description is to be referred to the description of FIG. 1 explained in Embodiment Mode 1.

Figure 4:
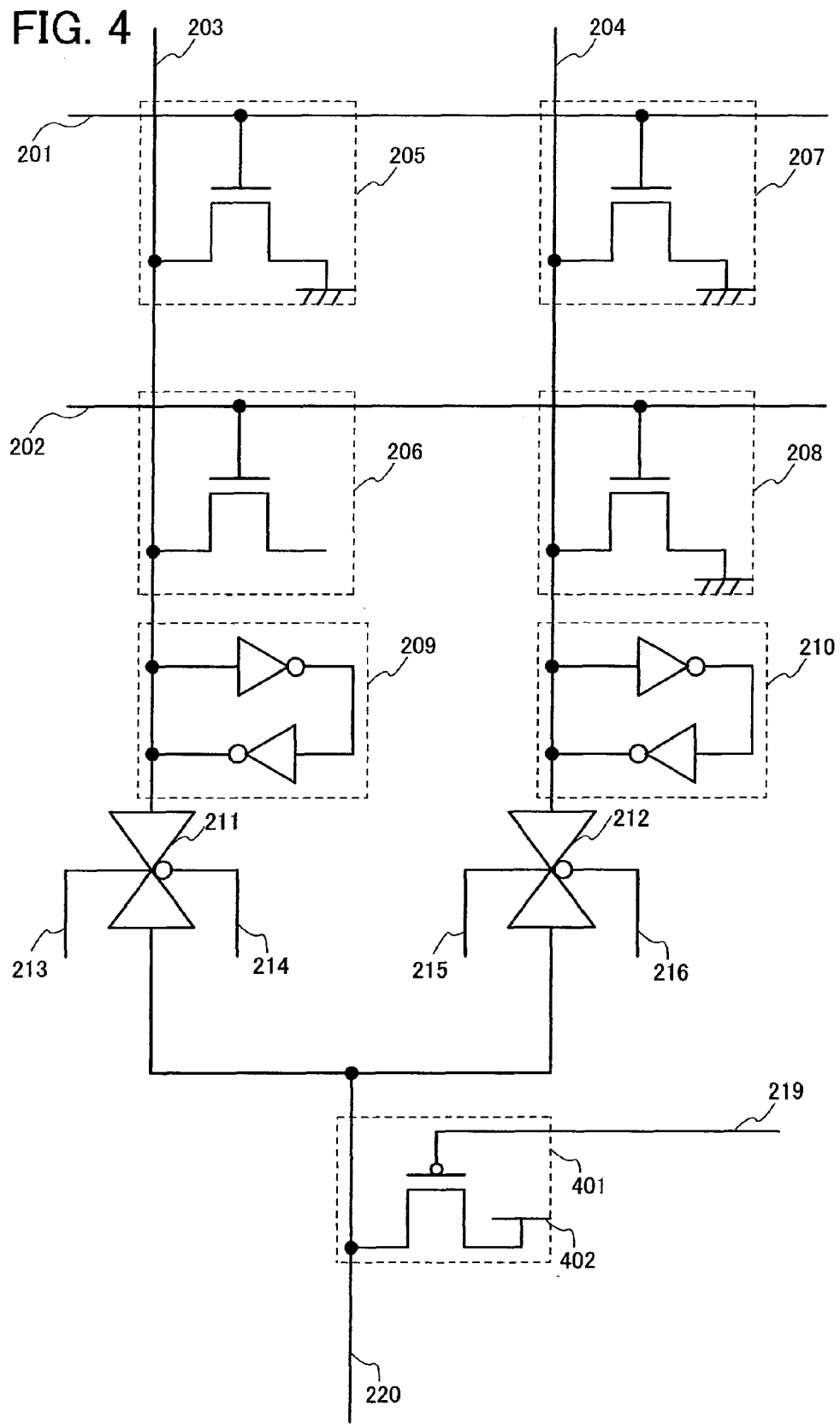
FIG. 4 is a circuit diagram of a precharge circuit in Embodiment Mode 2.

Further, FIG. 4 is a circuit diagram of a mask ROM of this embodiment mode. In this embodiment mode, the region 111 in FIG. 1, explained in Embodiment Mode 1 includes an n-th word line 201, an (n+1)th word line 202, an m-th bit line 203, an (m+1)th bit line 204, a memory cell 205 of n-th row and m-th column, which is arranged at the point where the n-th word line 201 and the m-th bit line 203 intersect, a memory cell 206 of (n+1)th row and m-th column, which is arranged at the point where the (n+1)th word line 202 and the m-th bit line 203 intersect, a memory cell 207 of n-th row and (m+1)th column, which is arranged at the point where the n-th word line 201 and the (m+1)th bit line 204 intersect, a memory cell 208 of (n+1)th row and (m+1)th column, which is arranged at the point where the (n+1)th word line 202 and the (m+1)th bit line 204 intersect, an m-th latch circuit 209, an (m+1)th latch circuit 210, an m-th analog switch 211, an (m+1)th analog switch 212, an m-th select signal line 213, an m-th inverted select signal line 214, an (m+1)th select signal line 215, an (m+1)th inverted select signal line 216, a precharge circuit 401, a read enable signal line 219, and an output data signal line 220 of the memory.

The memory cell 205 of n-th row and m-th column, the memory cell 206 of (n+1)th row and m-th column, the memory cell 207 of n-th row and (m+1)th column, and the memory cell 208 of (n+1)th row and (m+1)th column are each formed from one N-channel transistor. Here, in the memory cell 205 of n-th row and m-th column, the gate of the N-channel transistor is electrically connected to the n-th word line 201, the source to the ground line, and the drain to the m-th bit line 203, respectively. In the memory cell 206 of (n+1)th row and m-th column, the gate of the N-channel transistor is electrically connected to the (n+1)th word line 202, the drain to the m-th bit line 203, and the source is not electrically connected to be in a floated state. In the memory cell 207 of the n-th row and (m+1)th column, the gate of the N-channel transistor is electrically connected the n-th word line 201, the source to the ground line, the drain to the (m+1)th bit line 204, respectively. In the memory cell 208 of (n+1)th row and (m+1)th column, the gate of the N-channel transistor is electrically connected to the (n+1)th word line 202, the source to the ground line, and the drain to the (m+1)th bit line 204, respectively. Further, the precharge circuit 401 is formed from a P-channel transistor. The gate of the P-channel transistor of the precharge circuit 401 is electrically connected to the read enable signal line 219, the source to a power line 402, the drain to the output data signal line 220 of the memory, respectively.

Both the m-th select signal line 213 and the m-th inverted select signal line 214 are electrically connected to the m-th analog switch 211. Note that the electric potential of the m-th select signal line 213 is set at H level, and the electric potential of the m-th inverted select signal line 214 is set at L level; thus, the m-th analog switch 211 can be made to be electrically conducting or non-conducting. Both the (m+1)th select signal line 215 and the (m+1)th inverted select signal line 216 are electrically connected to the (m+1)th analog switch 212. Note that the electric potential of the (m+1)th select signal line 215 is set at H level, and the electric potential of the (m+1)th inverted select signal line 216 is set at L level; thus, the (m+1)th analog switch 212 can be made to be electrically conducting or non-conducting. Note that the electric potential of the m-th select signal line 213 and the electric potential of the (m+1)th select signal line 215 are generated by decoding of certain bits of memory address signals. Accordingly, one of them is set at H level, and the other is set at L level. Further, when the electric potential of the m-th select signal line 213 is set at L level, the electric potential of the m-th inverted select signal line 214 is set at H level, and when the electric potential of the m-th select signal line 213 is set at H level, the electric potential of the m-th inverted select signal line 214 is set at L level. Similarly, when the electric potential of (m+1)th select signal line 215 is set at L level, the electric potential of the (m+1)th inverted select signal line 216 is set at H level, and when the electric potential of the (m+1)th select signal line 215 is set at H level, the electric potential of the (m+1)th inverted select signal line 216 is set at L level.

Note that a timing chart of the structure of a mask ROM shown in FIG. 4 is similar to that of the structure described in Embodiment Mode 1 with reference to FIG. 3. Therefore, in this embodiment mode, the description is to be referred to the description of FIG. 3 explained in Embodiment Mode 1.

The structure of the mask ROM in FIG. 4 is different from the structure of FIG. 2 in Embodiment Mode 1 in that the precharge circuits are provided corresponding to each line in FIG. 2 whereas one precharge circuit 401 is provided corresponding to a plurality of bit lines.

Accordingly, comparing FIG. 2 which is a circuit diagram of the mask ROM of Embodiment Mode 1 and FIG. 4 which is a circuit diagram of the mask ROM of Embodiment Mode 2, the number of the transistors associated with precharge circuits is smaller in FIG. 4. The timing charts of the mask ROMs in FIG. 2 and FIG. 4 are alike, and the mask ROMs have like performance characteristics in terms of power consumption. Accordingly, the one shown in FIG. 4 is superior in that the umber of the transistors associated with precharge circuits is smaller, which permits miniaturization. Therefore, a semiconductor device mounted with the mask ROM shown in FIG. 4, which is smaller than a semiconductor device mounted with the mask ROM shown in FIG. 2 can be can be provided.

With the above structure, a low power consumption semiconductor device having a memory, which is also miniaturized can be provided.

Note that this embodiment mode can be implemented in combination with any of other embodiment modes and other embodiments as appropriate.

Embodiment 1

A memory of the present invention can be used for electronic appliances of a variety of fields that are equipped with a memory. That is, the present invention includes electronic appliances equipped with a memory. For example, a camera such as a video camera or a digital camera; a goggle-type display (head-mounted display); a navigation system; a sound reproduction system (a car audio system, an audio component, and the like); a computer; a game machine; a portable information terminal (a mobile computer, a portable phone, a portable game machine, an electronic book, and the like); an image reproduction device equipped with a recording medium (specifically, a device that can reproduce a recording medium such as a DVD (digital versatile disc) and that is equipped with a display that can display the image); and the like can be given as electronic appliances to which the semiconductor device of the present invention is applied. Specific examples of such electronic appliances are shown in FIGS. 8A to 8E.

Figure 8A:
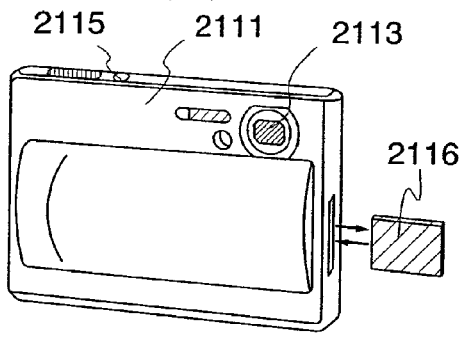
FIGS. 8A to 8E are diagrams illustrating structures of Embodiment 1 using the present invention.
Figure 8B:
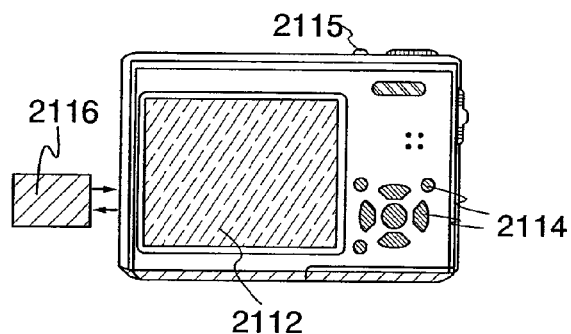

FIGS. 8A and 8B show a digital camera. FIG. 8B is a rear view of the camera in FIG. 8A. This digital camera includes a housing 2111, a display portion 2112, a lens 2113, an operation key 2114, and a shutter-release button 2115. The digital camera also includes a memory 2116 that can be taken out, and data taken by this digital camera is stored in the memory 2116. The semiconductor device of the present invention can be applied to the memory 2116.

Figure 8C:
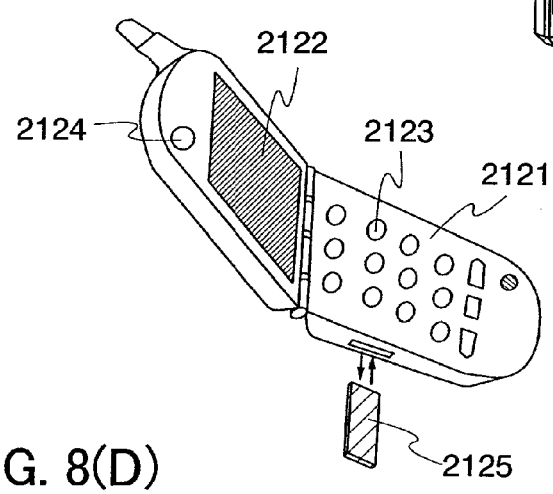

Further, FIG. 8C shows a portable phone, which is a typical example of portable terminals. This portable phone includes a housing 2121, a display portion 2122, an operation key 2123, and the like. Moreover, the portable phone includes a memory 2125 that can be taken out, and data such as telephone number of the portable phone, an image, music data, or the like can be stored in the memory 2125 and reproduced. The semiconductor device of the present invention can be applied to the memory 2125.

Figure 8D:
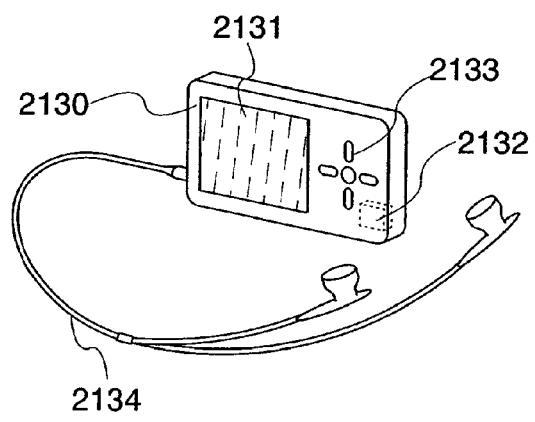

Further, FIG. 8D shows a digital player, which is a typical example of an audio device. The digital player shown in FIG. 8D includes a main body 2130, a display portion 2131, a memory portion 2132, an operation portion 2133, earphones 2134, and the like. Note that the earphones 2134 can be replaced with headphones or wireless earphones. The semiconductor device of the present invention can be used for the memory portion 2132. For example, by operating the operation portion 2133 using a high-capacity memory with a storage capacity of 20 to 200 gigabytes (GB), an image or audio (music) can be recorded and reproduced. Note that power consumption of the display portion 2131 can be suppressed by displaying white characters on a black background. This is particularly effective in a portable type audio device. Also, the memory portion 2132 may be a type that can be taken out.

Figure 8E:
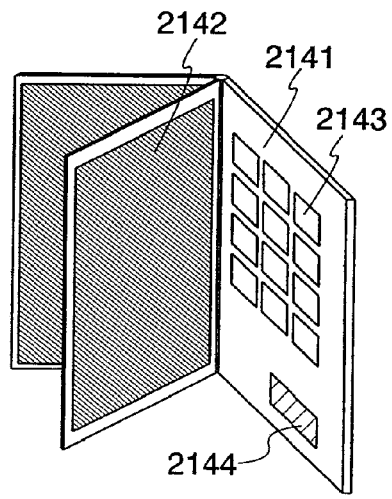

FIG. 8E shows an electronic book (also called electronic paper). This electronic book includes a main body 2141, a display portion 2142, an operation key 2143, and a memory portion 2144. Also, a modem may be incorporated in the main body 2141, or the electronic book may be formed to be capable of transmitting and receiving information wirelessly. For the memory portion 2144, a semiconductor device of the present invention can be used. For example, by operating the operation key 2143 using a memory with a storage capacity of 20 to 200 gigabytes (GB), an image or audio (music) can be recorded and reproduced. Note that the memory portion 2144 may be a type that can be taken out.

As described above, an application range of the present invention is extremely wide, and the present invention can be used in electronic appliances of a variety of fields that include memories. Since the semiconductor device of the present invention consumes low power, it makes it possible to carry around data in a battery-driven electronic appliance such as that shown in FIGS. 8A to 8E without influencing driving time of the battery.

Note that this embodiment can be implemented in combination with any of other embodiment modes and other embodiments as appropriate.

Embodiment 2

In recent years, a compact semiconductor device (hereinafter referred to as a wireless chip) that is a combination of an ultra compact IC chip and an antenna for wireless communication has received a lot of attention. Data can be written to or read from the wireless chip by transferring and receiving a communication signal (operation magnetic field) using a wireless communication device (hereinafter referred to as a reader/writer).

As an application field of the wireless chip, merchandise management in the distribution industry is given as an example. Now, although merchandise management utilizing a barcode is mainstream, since a barcode is read optically, data cannot be read when there is an interrupting object. Meanwhile, since the wireless chip reads data wirelessly, the data can be read even if there is an interruption object which can pass communication signals. Consequently, increase in efficiency of merchandise management, lower cost, and the like are expected. In addition, the wireless chip is expected to be widely applied to, for example, train tickets, airplane tickets, and automatic resets.

As the range of application of wireless chips expands, wireless chips having further advanced functions are increasingly in demand. For example, data is expected to be prevented from being leaked to a third party by encrypting transmitted/received data. For this purpose, there are methods of performing coding/decoding processing: one using hardware, another using software, and the other using both hardware and software. In the method of processing using hardware, an arithmetic circuit is a circuit dedicated for coding/decoding. In the method of processing using software, an arithmetic circuit includes a CPU (Central Processing Unit) and a large scale memory, and the CPU executes a coding/decoding program. In the method of processing using both hardware and software, an arithmetic circuit includes a coding/decoding dedicated circuit, a CPU, and a memory; the dedicated circuit performs part of arithmetic processing of coding/decoding, and the CPU executes programs other than arithmetic processing. However, in any case, a wireless chip is to be provided with a high-capacity memory. By applying the present invention, increase in power consumption in accordance with increase in capacity of a memory can be prevented.

Figure 9:
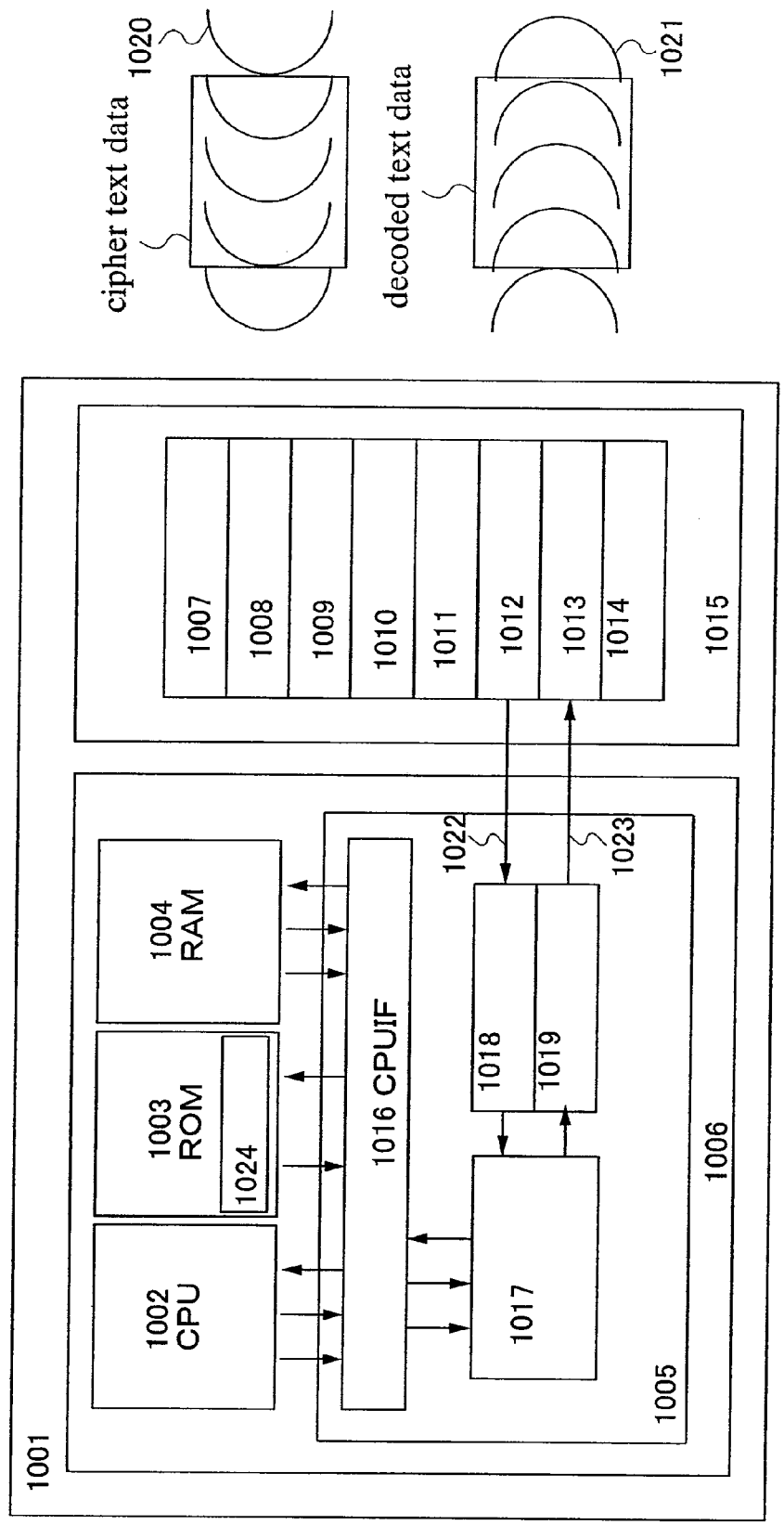
FIG. 9 is a diagram illustrating a structure of Embodiment 2 using the present invention.
Figure 10:
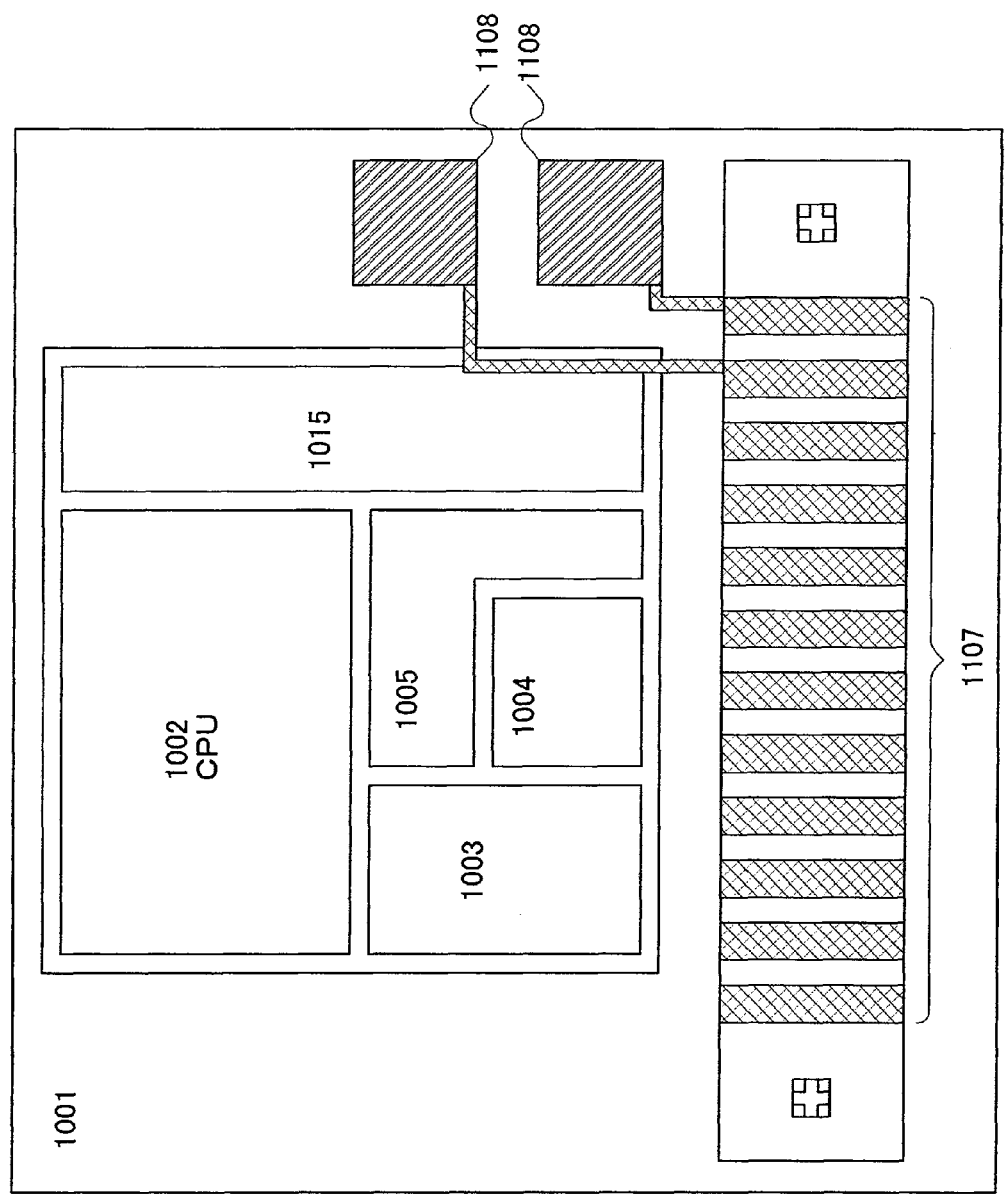
FIG. 10 is a diagram illustrating a structure of Embodiment 2 using the present invention.

In this embodiment, as an example of a semiconductor device according to the present invention, a wireless chip having a cipher processing function is described with reference to FIG. 9 and FIG. 10. FIG. 9 is a block diagram of the wireless chip, and FIG. 10 is a layout diagram of the wireless chip.

First, a block structure of the wireless chip is described with reference to FIG. 9. In FIG. 9, a wireless chip 1001 includes an arithmetic circuit 1006 which includes a CPU 1002, a ROM 1003, a RAM 1004 and a controller 1005; and an analog portion 1015 which includes an antenna 1007, a resonance circuit 1008, a power source circuit 1009, a reset circuit 1010, a clock generating circuit 1011, a demodulation circuit 1012, a modulation circuit 1013, and a power source managing circuit 1014. The controller 1005 includes a CPU interface (CPUIF) 1016, a control register 1017, a code extracting circuit 1018, and an encoding circuit 1019. Note that although in FIG. 9, a communication signal is shown separated into a reception signal 1020 and a transmission signal 1021 for simplification of the description, they actually overlap each other and are transmitted and received simultaneously between the wireless chip 1001 and a reader/writer. The reception signal 1020 is demodulated by the demodulation circuit 1012 after they are received by the antenna 1007 and the resonance circuit 1008. Also, the transmission signal 1021 is transmitted from the antenna 1007 after it is modulated by the modulation circuit 1013.

In FIG. 9, when the wireless chip 1001 is placed inside the magnetic field generated by a communication signal, induced electromotive force is produced by the antenna 1007 and the resonance circuit 1008. The induced electromotive force is held by a capacitor in the power source circuit 1009, further, the potential is stabilized by the capacitor, and the induced electromotive force is supplied as power supply voltage to each circuit of the wireless chip 1001. The reset circuit 1010 generates an original reset signal for the whole wireless chip 1001. For example, the reset circuit generates a signal which rises after rise in the power supply voltage with delay as a reset signal. The clock generating circuit 1011 changes the frequency of a clock signal and the duty ratio in response to a control signal generated by the power source managing circuit 1014. The demodulation circuit 1012 detects amplitude variation of the received signal 1020 of an ASK system as received data 1022 of "0"/"1". The demodulation circuit 1012 is, for example, a low-pass filter. Further, the modulation circuit 1013 transmits transmitted data by varying amplitude of the transmitted signal 1021 of an ASK system. For example, in a case where a transmitted data 1023 is "0", the resonance point of the resonance circuit 1008 is changed, thereby changing amplitude of the communication signal. The power source managing circuit 1014 monitors the power supply voltage supplied from the power source circuit 1009 to the arithmetic circuit 1006 or current consumption in the arithmetic circuit 1006, thereby generating a control signal for changing frequency of the clock signal and the duty ratio in the clock generating circuit 1011.

An operation of a wireless chip of this embodiment is described. First, a signal 1020 transmitted from the reader/writer, which includes cipher text data, is received by the wireless chip 1001. After the received signal 1020 is demodulated by the demodulation circuit 1012, the received signal 1020 is separated into a control command, cipher text data, and the like by a code extracting circuit 1018, and then it is stored in the control register 1017. Here, the control command is a data for designating response of the wireless chip 1001. For example, transmission of a unique ID number, operation stop, decoding, and the like are designated. Here, assume that a control command for decoding is received.

Subsequently, in the arithmetic circuit 1006, a CPU 1002 decodes a cipher text using a private key 1024 stored in a ROM 1003 in advance in accordance with a decoding program stored in the ROM 1003. The decoded cipher text (decoded text) is stored in the control register 1017. At that time, the RAM 1004 is used as a data storing region. Note that the CPU 1002 accesses the ROM 1003, the RAM 1004, and the control register 1017 via the CPU INTERFACE 1016. The CPU INTERFACE 1016 has a function of generating an access signal with respect to any one of the ROM 1003, the RAM 1004, and the control register 1017 in accordance with the address which the CPU 1002 demands.

Finally, in the encoding circuit 1019, the transmitted data 1023 is generated from the decoded text and modulated by the modulation circuit 1013, and the transmitted signal 1021 is transmitted to the reader/writer from the antenna 1007.

Note that in this embodiment, a method using software, that is a system in which an arithmetic circuit includes a CPU and a large scale memory, and a program is executed by the CPU has been described as an arithmetic method; however, an optimal arithmetic method may be selected in accordance with the purpose and an arithmetic circuit can be formed based on the optimal arithmetic method. For example, as other arithmetic methods, there are a method using hardware, in which arithmetic processing is performed using an arithmetic circuit formed from a circuit dedicated to a certain processing, and a method using both hardware and software. In the method of processing using both hardware and software, an arithmetic circuit may include a dedicated circuit, a CPU, and a memory; the dedicated circuit performs a part of arithmetic processing, and the CPU executes programs other than arithmetic processing.

Next, a layout configuration of a wireless chip is described with reference to FIG. 10. Note that, in FIG. 10, components corresponding to the components shown in FIG. 9 are denoted by the same reference numerals and description thereof is omitted.

In FIG. 10, an FPC pad 1107 is an electrode pad group used for attaching an FPC (Flexible Print Circuit) to the wireless chip 1001, and an antenna bump 1108 is an electrode pad used for attaching the antenna (not shown). Note that when attaching the antenna, excess pressure may be applied to the antenna bump 1108. Therefore, it is desirable that components for forming a circuit such as a transistor are not placed under the antenna bump 1108.

The FPC pad 1107 is mainly effective when used for failure analysis. In the wireless chip, since power supply voltage is obtained by a communication signal, for example, the arithmetic circuit does not operate completely when defects are generated in the antenna or the power source circuit. Accordingly, failure analysis is very difficult. However, when power supply voltage is supplied to the wireless chip 1001 from the FPC via the FPC pad 1107 and an arbitrary electrical signal is input instead of an electrical signal supplied from the antenna, the arithmetic circuit can be operated. Accordingly, failure analysis can be carried out efficiently.

In addition, it is more effective to place the FPC pad 1107 such that measurement using a prober can be carried out. Specifically, in the FPC pad 1107, when the electrode pad is placed in accordance with a pitch of the prober needle, measurement using a prober is enabled. With the use of a prober, the number of steps for attaching the FPC can be eliminated at a time of failure analysis. Further, measurement can be performed even in the state where a plurality of wireless chips is formed over the substrate; thus, the number of steps for division into individual chips can be eliminated as well. Further, quality inspection of wireless chips can be carried out immediately before the step of attaching an antenna in mass-production. Thus, defectives can be screened out in an earlier stage in the process flow, so that production cost can be reduced.

Note that this embodiment can be implemented in combination with any of other embodiment modes and other embodiments as appropriate. Specifically, regarding a memory mounted on a wireless chip, which is a semiconductor device, bit lines can be selectively precharged. Accordingly, bit lines which are not associated with reading of data from a memory are not precharged; thus, a semiconductor device equipped with a semiconductor device can be provided.

Embodiment 3

In this embodiment, a method of manufacturing a wireless chip shown in the above Embodiments will be described. Each circuit forming a wireless chip in accordance with the present invention can be formed from thin film transistors. In this embodiment, a method of manufacturing a flexible wireless chip by forming circuits included in the wireless chip from thin film transistors, transferring the circuits from a substrate used for the manufacturing of the thin film transistors to a flexible (flexible) substrate will be described.

In this embodiment, P-channel TFTs (hereinafter also referred to as Pch-TFT) and N-channel TFTs (hereinafter also referred to as Nch-TFT) for forming an inverter and the like, and an antenna over the thin film transistor are typically shown as a circuit forming the wireless chip. A method of manufacturing a wireless chip will be explained below with reference to cross-sectional views shown in FIG. 11A to FIG. 13B.

First, a release layer 1303 is formed over one surface of a substrate 1301 with an insulating film 1302 interposed therebetween, and then an insulating film 1304 functioning as a base film and a semiconductor film (for example, a film containing amorphous silicon) 1305 are formed thereover (see FIG. 11A). Note that the insulating film 1302, the release layer 1303, the insulating film 1304, and the amorphous semiconductor film 1305 can be formed consecutively.

The substrate 1301 is selected from among a glass substrate, a quartz substrate, a metal substrate (for example, a stainless steel substrate or the like), a ceramic substrate, a semiconductor substrate such as a Silicon substrate, or the like. Alternatively, a plastic substrate made of polyethylene terephthalate (PET), polyethylene naphthalate (PEN), polyether sulfone (PES), acrylic, or the like can be used. In the step shown in FIG. 11A, although the release layer 1303 is provided over the entire surface of the substrate 1301 with the insulating film 1302 therebetween; alternatively, the release layer may be selectively formed by photolithography after being provided over the entire surface of the substrate 1301.

The insulating films 1302 and 1304 are formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when each of the insulating films 1302 and 1304 is formed to have a two-layer structure, it is preferable to form a silicon nitride oxide film as a first insulating film and form a silicon oxynitride film as a second insulating film. In addition, it is also possible to form a silicon nitride film as a first insulating film and form a silicon oxide film as a second insulating film. The insulating film 1302 functions as a blocking layer which prevents an impurity element contained in the substrate 1301 from being mixed into the release layer 1303 or elements formed thereover. The insulating film 1304 functions as a blocking layer which prevents an impurity element contained in the substrate 1301 or the release layer 1303 from being mixed into elements formed over the insulating film 1304. In this manner, providing the insulating films 1302 and 1304 which function as the blocking layers can prevent adverse effects on the elements formed over the release layer 1303 or the insulating film 1304, which would otherwise be caused by an alkaline metal such as Na or an alkaline earth metal contained in the substrate 1301 or by the impurity element contained in the release layer. Note that when quartz is used for the substrate 1301, for example, the insulating films 1302 and 1304 may be omitted.

The release layer 1303 may be formed using a metal film or a stacked structure of a metal film and a metal oxide film. As a metal film, either a single layer or stacked layers are formed using an element selected from among tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing such an element as a main component. In addition, such materials can be deposited by a sputtering method, various CVD methods such as a plasma CVD method, or the like. A stacked structure or a metal film and a metal oxide film can be obtained by the steps of forming the above-described metal film, applying plasma treatment thereto under an oxygen atmosphere or an $N_2O$ atmosphere or applying thermal treatment thereto under an oxygen atmosphere or an $N_2O$ atmosphere, and thereby forming oxide or oxynitride or the metal film on the metal film. For example, when a tungsten film is provided as a metal film by a sputtering method, a CVD method, or the like, a metal oxide film made of tungsten oxide can be formed on the surface of the tungsten film. In that case, the tungsten oxide can be represented by $WO_x$ where x is in the range of 2 to 3. For example, there are cases where x is 2 ($WO_2$), x is 2.5 ($W_2O_5$), x is 2.75 ($W_4O_{11}$), x is 3 ($WO_3$), and the like. When forming tungsten oxide, there is no particular limitation on the value of x, and thus which of the above oxides is to be formed may be determined base on the etching rate of the like. In addition, high-density-plasma treatment may be applied as the plasma treatment, for example. Besides the metal oxide film, metal nitride or metal oxynitride may also be formed. In that case, plasma treatment or thermal treatment may be applied to the metal film under a nitrogen atmosphere or an atmosphere containing nitrogen and oxygen.

The amorphous semiconductor film 1305 is formed to a thickness of 25 to 200 nm (preferably, 30 to 150 nm) by a sputtering method, an LPCVD method, a plasma CVD method, or the like.

Next, the amorphous semiconductor film 1305 is crystallized by laser irradiation. Note that the crystallization of the amorphous semiconductor film 1305 may also be conducted by a method combining the laser crystallization with a thermal crystallization method using RTA or an annealing furnace or with a thermal crystallization method using a metal element which promotes the crystallization. After that, the crystallized semiconductor film is etched into desired shapes, whereby crystalline semiconductor films 1305a to 1305f are formed. Then, a gate insulating film 1306 is formed so as to cover the semiconductor films 1305a to 1305f (see FIG. 11B).

The gate insulating film 1306 is formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when the gate insulating film 1306 is formed to have a two-layer structure, it is preferable to form a silicon oxynitride film as a first insulating film and form a silicon nitride oxide film as a second insulating film. Alternatively, it is also possible to form a silicon oxide film as a first insulating film and form a silicon nitride film as a second insulating film.

An example of a manufacturing process of the crystalline semiconductor films 1305a to 1305f will be briefly described below. First, an amorphous semiconductor film with a thickness of 50 to 60 nm is formed by a plasma CVD method. Then, a solution containing nickel which is a metal element for promoting crystallization is retained on the amorphous semiconductor film, which is followed by dehydrogenation treatment (500° C. for one hour) and thermal treatment (550° C. for four hours). Thus, a crystalline semiconductor film is formed. Then, the crystalline semiconductor film is irradiated with laser light and a photolithography method is used, whereby the crystalline semiconductor films 1305a to 1305f are formed. Note that crystallization of the amorphous semiconductor film may be conducted only by using laser crystallization without using thermal crystallization which uses a metal element for promoting crystallization.

As a laser oscillator used for crystallization, either a continuous wave laser (a CW laser) or a pulsed laser can be used. As a laser that can be used here, there are gas lasers such as an Ar laser, a Kr laser, and an excimer laser; a laser in which single-crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more laser media selected from among Nd, Yb, Cr, Ti, Ho, Er, Tm, and Ta as dopant; a glass laser; a ruby laser; an alexandrite laser; a Ti:sapphire laser; a copper vapor laser; and a metal vapor laser. When irradiation is conducted with the fundamental wave of such a laser beam or the second to fourth harmonics of the fundamental wave, crystals with a large grain size can be obtained. For example, the second harmonic (532 nm) or the third harmonic (355 nm) of an Nd:$YVO_4$ laser (the fundamental wave of 1064 nm) can be used. In this case, a laser power density of about 0.01 to 100 $MW/cm^2$ (preferably, 0.1 to 10 $MW/cm^2$) is required, and irradiation is conducted with a scanning rate of about 10 to 2000 cm/sec. Note that the laser in which single-crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more laser media selected from among Nd, Yb, Cr, Ti, Ho, Er, Tm, and Ta as dopant; an Ar laser, or a Ti:sapphire laser can be used as a CW laser, whereas they can also be used as pulsed laser with a repetition rate of 10 MHz or more by being combined with a Q-switch operation or mode locking. When a laser beam with a repetition rate of 10 MHz or more is used, it is possible for a semiconductor film to be irradiated with the next pulse after it is melted by the previous laser but before it becomes solidified. Therefore, unlike the case of using a pulsed laser with a low repetition rate, a solid-liquid interface in the semiconductor film can be continuously moved. Thus, crystal grains which have grown continuously in the scanning direction can be obtained.

The gate insulating film 1306 can be formed by oxidizing or nitriding the surfaces of the semiconductor films 1305a to 1305f by the above-described high-density-plasma treatment. For example, plasma treatment with a mixed gas of a rare gas such as He, Ar, Kr, or Xe, and oxygen, nitrogen oxide ($NO_2$), ammonia, nitrogen, or hydrogen is used. When plasma is excited by the introduction of microwaves, plasma with a low electron temperature and a high electron density can be generated. With oxygen radicals (which may include OH radicals) or nitrogen radicals (which may include NH radicals) which are produced by the high-density plasma, the surfaces of the semiconductor films can be oxidized or nitrided.

By such high-density-plasma treatment, an insulating film with a thickness of 1 to 20 nm, typically 5 to 10 nm, is formed on the semiconductor films. Since the reaction in this case is a solid-phase reaction, interface state density between the insulating film and the semiconductor films can be quite low. Since such high-density-plasma treatment directly oxidizes (or nitrides) semiconductor films (crystalline silicon or polycrystalline silicon), the insulating film can be formed to have a uniform thickness, which is ideal. In addition, since crystal grain boundaries of crystalline silicon are not strongly oxidized, an excellent state results. That is, by the solid-phase oxidation of the surfaces of the semiconductor films by high-density-plasma treatment which is shown in this embodiment mode, an insulating film with a uniform thickness and low interface state density can be formed without excessive oxidation at the interface state density.

As the gate insulating film, only an insulating film formed by high-density-plasma treatment may be used, or it is also possible to use stacked layers which are obtained by depositing an insulating film such as silicon oxide, silicon oxynitride, or silicon nitride on the insulating film by a CVD method using plasma or thermal reaction. In either case, a transistor which includes an insulating film formed by high-density-plasma treatment in a part or the whole of its gate insulating film can have small characteristic variations.

In addition, the semiconductor films 1305a to 1305f, which are obtained by crystallizing the original semiconductor film by scanning in one direction along with the irradiation with a CW laser or a pulsed laser at a repetition rate of 10 MHz or more, have a characteristic in that their crystals have grown in the beam scanning direction. When a transistor is arranged so that its channel length direction (direction in which carriers move when a channel formation region is formed) is aligned with the scan direction, and the above-described gate insulating layer is combined with the semiconductor film, a thin film transistor (TFTs) with high electron field-effect mobility and few variations in characteristics can be obtained.

Next, a first conductive film and a second conductive film are stacked over the gate insulating film 1306. Here, the first conductive film is formed to a thickness of 20 to 100 nm by a CVD method, a sputtering method, or the like. The second conductive film is formed to a thickness of 100 to 400 nm. The first conductive film and the second conductive film are formed with an element selected from among tantalum (Ta), tungsten (W), titanium (Ti), molybdenum (Mo), aluminum (Al), copper (Cu), chromium (Cr), niobium (Nb), or the like, or an alloy material or a compound material containing such an element as a main component. Alternatively, the first conductive film and the second conductive are formed with a semiconductor material typified by polycrystalline silicon doped with an impurity element such as phosphorus. As a combination example of the first conductive film and the second conductive film, a tantalum nitride film and a tungsten film; a tungsten nitride film and a tungsten film; a molybdenum nitride film and a molybdenum film; and the like can be given. Tungsten and tantalum nitride have high heat resistance. Therefore, after forming the first conductive film and the second conductive film using tungsten and tantalum nitride, thermal treatment can be applied thereto for the purpose of thermal activation. In addition, in the case where a two-layer structure is not employed, but a three-layer structure is employed, it is preferable to use a stacked structure of a molybdenum film, an aluminum film, and a molybdenum film.

Next, a resist mask is formed by a photolithography method, and etching treatment for forming gate electrodes and gate lines is applied. Thus, gate electrodes 1307 are formed above the semiconductor films 1305a to 1305f. Here, a stacked structure of a first conductive film 1307a and a second conductive film 1307b is shown as an example of the gate electrode 1307.

Next, the semiconductor films 1305a, 1305b, 1305d, and 1305f are doped with an n-type impurity element at a low concentration, using the gate electrodes 1307 masks by an ion doping method or an ion implantation method. Then, a resist mask is selectively formed by a photolithography method, and the semiconductor films 1305c and 1305e are doped with a p-type impurity element at a high concentration. As an n-type impurity element, phosphorus (P), arsenic (As), or the like can be used. As a p-type impurity element, boron (B), aluminum (Al), gallium (Ga), or the like can be used. Here, phosphorus (P) is used as an n-type impurity element and is selectively introduced into the semiconductor films 1305a to 1305f such that they contain phosphorus at a concentration of $1\times10^{15}$ to $1\times10^{19}/cm^3$. Thus, n-type impurity regions 1308 are formed. In addition, boron (B) is used as a p-type impurity element, and is selectively introduced into the semiconductor films 1305c and 1305e such that they contain boron at a concentration of $1\times10^{19}$ to $1\times10^{20}/cm^3$. Thus, n-type impurity regions 1309 are formed (see FIG. 11C).

Next, an insulating film is formed so as to cover the gate insulating film 1306 and the gate electrodes 1307. The insulating film is formed to have either a single layer or stacked layers by depositing a film containing an inorganic material such as silicon, silicon oxide, or silicon nitride, or a film containing an organic material such as an organic resin by a plasma CVD method, a sputtering method, or the like. Next, the insulating film is selectively etched by anisotropic etching (mainly in the perpendicular direction), so that insulating films 1310 (also referred to as sidewalls) having a contact with the side surfaces of the gate electrodes 1307 are formed. The insulating films 1310 are used as doping masks for forming LDD (Lightly Doped Drain) regions.

Next, the semiconductor films 1305a, 1305b, 1305d, and 1305f are doped with an n-type impurity element at a high concentration, using the gate electrodes 1307 and the insulating films 1310 as masks. Thus, n-type impurity regions 1311 are formed. Here, phosphorus (P) is used as an n-type impurity element, and is selectively introduced into the semiconductor films 1305a, 1305b, 1305d, and 1305f such that they contain phosphorus at a concentration of $1\times10^{19}$ to $1\times10^{20}/cm^3$. Thus, the n-type impurity regions 1311 with a higher concentration of impurity than that of the impurity regions 1308 are formed.

Through the above steps, N-channel transistors 1300a, 1300b, 1300d, and 1300f, and P-channel thin film transistors 1300c and 1300e are formed (see FIG. 11D).

In the N-channel thin film transistor 1300a, a channel formation region is formed in a region which overlaps with the gate electrode 1307; the impurity region 1311 which forms a source or drain region is formed in a region which does not overlap with the gate electrode 1307 and the insulating film 1310; and a low concentration impurity region (LDD region: Lightly Doped Drain region) is formed in a region of the semiconductor film 1305a which overlaps with the insulating film 1310 and between the channel formation region and the impurity region 1311. Similarly, channel formation regions, low concentration impurity regions, and the impurity regions 1311 are formed in the N-channel thin film transistors 1300b, 1300d, and 1300f.

In the P-channel thin film transistor 1300c, a channel formation region is formed in a region which overlaps with the gate electrode 1307, and the impurity region 1309 which forms a source or drain region is formed in a region of the semiconductor film 1305c which does not overlap with the gate electrode 1307. Similarly, a channel formation region and the impurity region 1309 are formed in the P-channel thin film transistor 1300e. Here, although LDD regions are not formed in the P-channel thin film transistors 1300c and 1300e, LDD regions may be provided in the P-channel thin film transistors or a structure without LDD regions may be applied to the N-channel thin film transistors.

Next, an insulating film with a single layer or stacked layers is formed so as to cover the semiconductor films 1305a to 1305f, the gate electrodes 1307, and the like. Then, conductive films 1313 electrically connected to the impurity regions 1309 and 1311 which form the source and drain regions of the thin film transistors 1300*a* to 1300*f* are formed over the insulating film (see FIG. 12A). The insulating film is formed either in a single layer or in stacked layers, using an inorganic material such as silicon oxide or silicon nitride, an organic material such as polyimide, polyamide, benzocyclobutene, acrylic, or epoxy, a siloxane material, or the like by a CVD method, a sputtering method, a SOG method, a droplet discharge method, a screen printing method, or the like. Here, the insulating film is formed to have two layers such that a silicon nitride oxide film is formed as a first insulating film 1312*a* and a silicon oxynitride film is formed as a second insulating film 1312*b*. In addition, the conductive films 1313 can form the source and drain electrodes of the thin film transistors 1300*a* to 1300*f*.

Note that before the insulating films 1312*a* and 1312*b* are formed or after one or both of them is/are formed, thermal treatment is preferably applied for recovery of the crystallinity of the semiconductor films, activation of the impurity element which has been added into the semiconductor films, or hydrogenation of the semiconductor films. As the thermal treatment, thermal, annealing, laser annealing, RTA, or the like is preferably applied.

The conductive films 1313 are formed either in a single layer or in stacked layers of an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as a main component. An alloy material containing aluminum as a main component corresponds to, for example, a material which contains aluminum as a main component and also contains nickel, or a material which contains aluminum as a main component and also contains nickel and one or both of carbon and silicon. The conductive films 1313 are preferably formed to have a stacked structure of a barrier film, an aluminum-silicon (Al—Si) film, and a barrier film or a stacked structure of a barrier film, an aluminum silicon (Al—Si) film, a titanium nitride (TiN) film, and a barrier film. Note that "barrier film" corresponds to a thin film made of titanium, titanium nitride, molybdenum, or molybdenum nitride. Aluminum and aluminum silicon, which have high resistance values and are inexpensive, are the most suitable material for forming the conductive films 1313. When barrier layers are provided in the top layer and the bottom layer, generation of hillocks of aluminum or aluminum silicon can be prevented. In addition, when a barrier film made of titanium which is an element having a high reducing property is formed, even when there is a thin natural oxide film formed on the crystalline semiconductor film, the natural oxide film can be chemically reduced, and a favorable contact between the conductive film 1313 and the crystalline semiconductor film can be obtained.

Next, an insulating film 1314 is formed so as to cover the conductive films 1313, and conductive films 1315*a* and 1315*b* electrically connected to the conductive films 1313 which form the source electrode or the drain electrode of the thin film transistors 1300*a* and 1300*f* are formed. In addition, a conductive film 1316 electrically connected to the conductive film 1313 which forms the source electrode or the drain electrode of the thin film transistor 1300*b* is formed. Note that the conductive films 1315*a* and 1315*b* and the conductive film 1316 may be formed using the same material. The conductive films 1315*a* and 1315*b* and the conductive film 1316 may be formed using any material which has been described for the conductive film 1313 above.

Figure 12A:
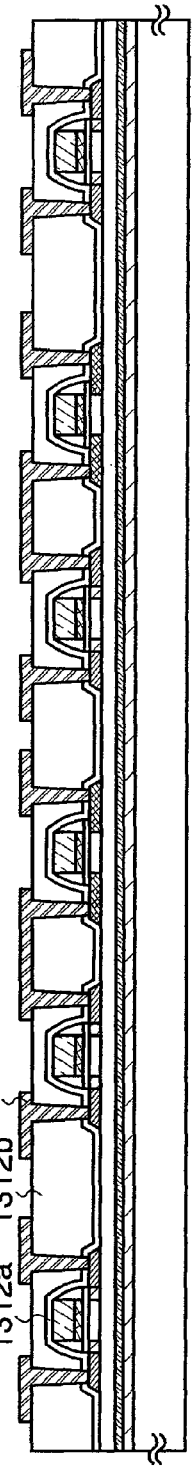
FIGS. 12A to 12C are diagrams illustrating a structure of Embodiment 3 using the present invention.
Figure 12B:
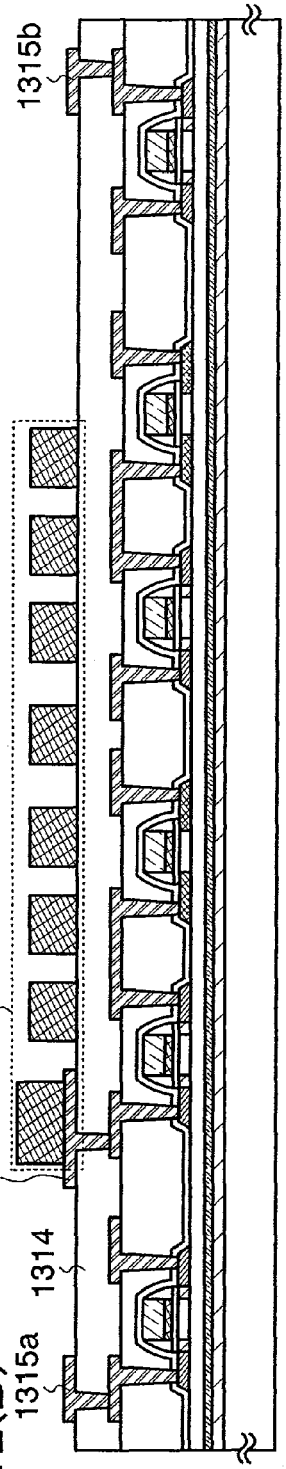
Figure 12C:
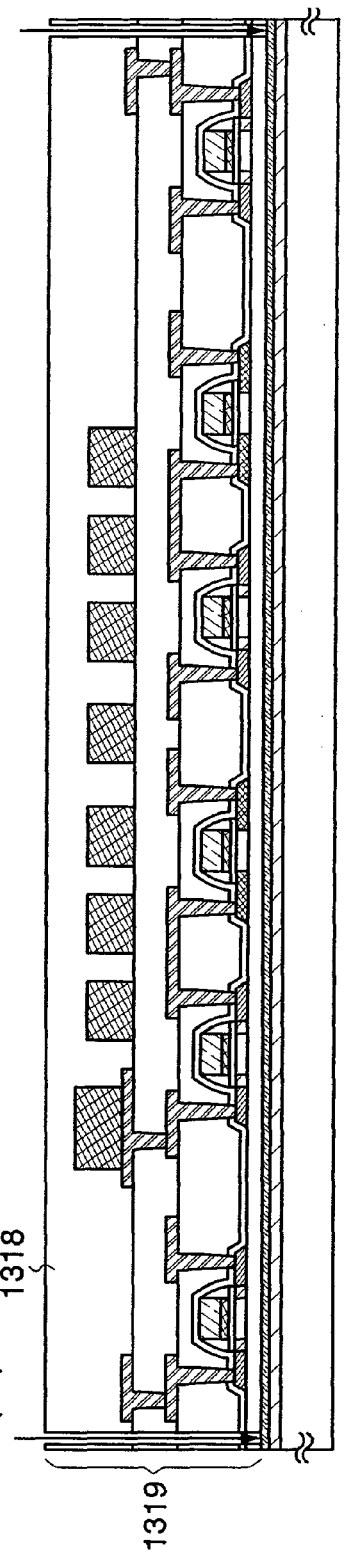

Next, a conductive film 1317 functioning as an antenna is formed to be electrically connected to the conductive film 1316 (see FIG. 12B).

The insulating film 1314 can be provided either in a single layer or in stacked layers, using an insulating film containing oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (Diamond-Like Carbon); an organic material such as epoxy, polyimide, polyamide, polyvinyl phenol, benzocyclobutene, or acrylic; a siloxane material containing a siloxane resin; or the like. Note that a siloxane material corresponds to a material having the bond of Si—O—Si. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent.

The conductive film 1317 can be formed with a conductive material by a CVD method, a sputtering method, a printing method such as screen printing or gravure printing, a droplet discharge method, a dispensing method, a plating method, or the like. The conductive material can be deposited either in a single layer or in stacked layers, using an element selected from among aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing such an element as a main component.

For example, when the conductive film 1317 functioning as the antenna is formed by a screen printing method, the antenna can be provided by selectively printing a conductive paste in which conductive particles with a particle size of several nm to several tens of μm are dissolved or dispersed in an organic resin. The conductive particles can be at least one of metal particles selected from among silver (Ag), gold (Ag), copper (Cu), nickel (Ni), platinum (Pt), palladium (Pd), tantalum (Ta), molybdenum (Mo), and titanium (Ti); fine particles of silver halide; and dispersive nanoparticles. In addition, the organic resin included in the conductive paste can be one or more of organic resins which function as a binder, a solvent, a dispersing agent, and a coating material for the metal particles. Typically, an organic resin such as an epoxy resin and a silicone resin can be given as examples. In addition, it is preferable to form the conductive film by the steps of extruding a conductive paste and baking it. For example, in the case of using fine particles (e.g., a particle size of 1 to 100 nm) containing silver as a main component as a material of the conductive paste, a conductive film can be obtained by baking and hardening the conductive paste at temperatures in the range of 150 to 300° C. Alternatively, it is also possible to use fine particles containing solder or lead-free solder as a main component. In that case, fine particles with a particle size of 20 μm or less are preferably used. Solder and lead-free solder have the advantage of low cost.

The conductive films 1315*a* and 1315*b* can function as wirings which are electrically connected to the battery included in the semiconductor device of the invention in a later step. In addition, in forming the conductive film 1317 which functions as the antenna, it is also possible to separately form another set of conductive films so as to be electrically connected to the conductive films 1315*a* and 1315*b*, so that the conductive films can be utilized as the wirings connected to the battery.

Next, after forming an insulating film 1318 so as to cover the conductive film 1317, layers including the thin film transistors 1300a to 1300f, the conductive film 1317, and the like (hereinafter referred to as an "element formation layer 1319") are peeled off the substrate 1301. Here, after forming openings excluding the region of the thin film transistors 1300a to 1300f by laser irradiation (e.g., UV light) (See FIG. 12C), the element formation layer 1319 can be peeled off the substrate 1301 with a physical force. It is also possible to selectively remove the release layer 1303 by introducing an etchant into the openings before peeling the element formation layer 1319 off the substrate 1301. As the etchant, a gas or a liquid containing halogen fluoride or an interhalogen compound is used. For example, when chlorine trifluoride ($ClF_3$) is used as the gas containing halogen fluoride, the element formation layer 1319 can be peeled off the substrate 1301. Note that the peeling layer 1301 may be partially kept remained without being entirely removed. Accordingly, the consumption of the etchant can be suppressed and a process time required for removing the peeling layer can be shortened. In addition, even after removing the peeling layer 1301, the element formation layer 1319 can be held above the substrate 1301. In addition, by reusing the substrate 1301 which the element formation layer 1319 has been peeled off, cost reduction can be achieved.

The insulating film 1318 can be formed either in a single layer or in stacked layers, using an insulating film containing oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (Diamond-Like Carbon); an organic material such as epoxy, polyimide, polyamide, polyvinyl phenol, benzocyclobutene, or acrylic; a siloxane material containing a siloxane resin; or the like by a CVD method, a sputtering method, or the like.

In this embodiment, after forming the openings in the element formation layer 1319 by laser irradiation, a first seat material 1320 is attached to one surface of the element formation layer 1319 (the surface where the insulating film 1318 is exposed), and then the element formation layer 1319 is peeled off the substrate 1301 (see FIG. 13A).

Next, a second seat material 1321 is attached to the other surface of the element formation layer 1319 (the surface exposed by peeling), followed by one or both of thermal treatment and pressurization treatment so that the second seat material 1321 is tightly fixed (see FIG. 13B). As the first seat material 1320 and the second seat material 1321, hot-melt films and the like can be used.

As the first sheet material 1320 and the second sheet material 1321, a film on which antistatic treatment for preventing static electricity or the like has been applied (hereinafter referred to as an antistatic film) can be used. As examples of the antistatic film, a film in which an antistatic material is dispersed in a resin, a film to which an antistatic material is attached, and the like can be given. The film provided with an antistatic material can be a film with an antistatic material provided over one of its surfaces, or a film with an antistatic material provided over each of its surfaces. Concerning the film with an antistatic material provided over one of its surfaces, the film may be attached to the element formation layer 1319 so that the antistatic material is placed on the inner side of the film or the outer side of the film. The antistatic material may be provided over the entire surface of the film, or over a part of the film. As an antistatic material, a metal; indium tin oxide (ITO); a surfactant such as an amphoteric surfactant; a cationic surfactant, or a nonionic surfactant; or the like can be used. In addition, as an antistatic material, a resin material which contains a cross-linked copolymer having a carboxyl group and a quaternary ammonium base on its side chain, or the like can be used. By attaching, mixing, or applying such a material to a film, an antistatic film can be formed. By sealing the element formation layer 1319 using the antistatic film, the semiconductor elements can be prevented from adverse effects such as external static electricity when dealt with as a commercial product.

Note that this embodiment can be implemented in combination with any of other embodiment modes and other embodiments as appropriate. Specifically, regarding a memory mounted on a semiconductor device, bit lines can be selectively precharged. Accordingly, bit lines which are not associated with reading of data from a memory are not precharged; thus, a semiconductor device equipped with a semiconductor device can be provided.

Embodiment 4

In this embodiment, a method of manufacturing a wireless chip different from that of the above embodiments will be described. A transistor of the present invention can be a MOS transistor on a single crystalline substrate other than a thin film transistor over an insulating substrate, which is described in the above embodiments.

In this embodiment, P-channel TFTs (hereinafter also referred to as Pch-TFT) and N-channel TFTs (hereinafter also referred to as Nch-TFT) for forming an inverter and the like are typically shown as a circuit forming the wireless chip. A method of manufacturing a wireless chip will be explained below with reference to cross-sectional views shown in FIG. 14A to FIG. 16.

Figure 14A:
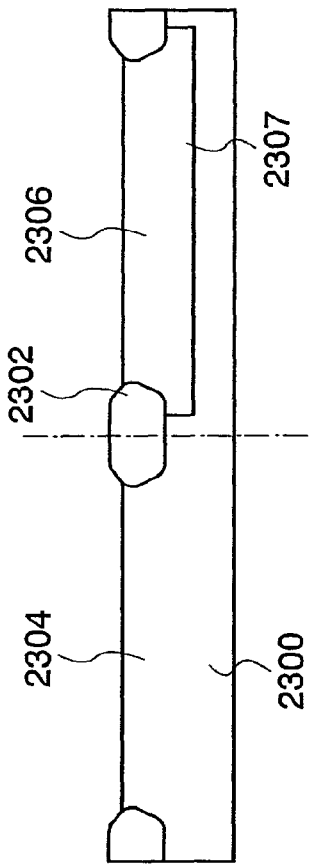
FIGS. 14A to 14C are diagrams illustrating a structure of Embodiment 3 using the present invention.

First, element regions 2304 and 2306 (hereinafter simply referred to as regions 2304 and 2306) are formed in a semiconductor substrate 2300 (see FIG. 14A). The regions 2304 and 2306 provided in the semiconductor substrate 2300 are insulated from each other by an insulating film (also referred to as a field oxide film) 2302. The example shown herein is the case where a single-crystalline Si substrate having n-type conductivity is used as the semiconductor substrate 2300, and a p-well 2307 is formed in the region 2306 of the semiconductor substrate 2300.

Any substrate can be used as the substrate 2300 as long as it is a semiconductor. For example, a single-crystalline Silicon substrate having n-type or p-type conductivity, a compound semiconductor substrate (e.g., a GaAs substrate, an InP substrate, a GaN substrate, a SiC substrate, a sapphire substrate, or a ZnSe substrate), a SOI (Silicon on Insulator) substrate formed by using a bonding method or a SIMOX (Separation by IMplanted OXygen), or the like can be used.

The regions 2304 and 2306 can be formed by a selective oxidation (LOCOS: LOCal Oxidation of Silicon) method, a trench isolation method, or the like.

In addition, the p-well formed in the region 2306 of the semiconductor substrate 2300 can be formed by selectively doping the semiconductor substrate 2300 with a p-type impurity element. As a p-type impurity element, boron (B), aluminum (Al), gallium (Ga), or the like can be used.

In this embodiment, although the region 2304 is not doped with an impurity element because an n-type semiconductor substrate is used as the semiconductor substrate 2300, an n-well may be formed in the region 2304 by introducing an n-type impurity element. As an n-type impurity element, phosphorus (P), arsenic (As), or the like can be used. When a p-type semiconductor substrate is used, on the other hand, a structure may be employed in which the region 2304 is doped with an n-type impurity element to form an n-well, whereas the region 2306 is not doped with an impurity element.

Figure 14B:
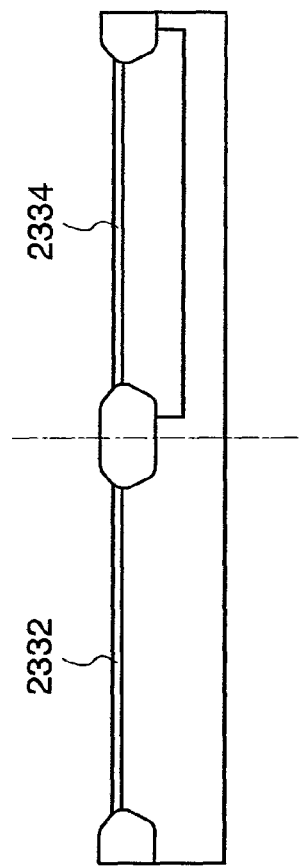

Next, insulating films 2332 and 2334 are formed so as to cover the regions 2304 and 2306, respectively (see FIG. 14B).

The insulating films 2332 and 2334 can be formed by, for example, forming silicon oxide films by oxidizing the surfaces of the regions 2304 and 2306 by thermal treatment. Alternatively, the insulating films 2332 and 2334 can be formed to have a stacked structure of a silicon oxide film and a film containing oxygen and nitrogen (a silicon oxynitride film) by conducting the steps of forming a silicon oxide film by a thermal oxidation method and then nitriding the surface of the silicon oxide film by nitridation treatment.

Further alternatively, the insulating films 2332 and 2334 can be formed by using plasma treatment as described above. For example, the insulating films 2332 and 2334 can be formed using a silicon oxide ($SiO_x$) film or a silicon nitride ($SiN_x$) film which is obtained by applying high-density-plasma oxidation or nitridation treatment to the surfaces of the regions 2304 and 2304 provided in the semiconductor substrate 2300. Further, after applying high-density-plasma oxidation treatment to the surfaces of the regions 2304 and 2306, high-density-plasma nitridation treatment may be conducted. In that case, silicon oxide films are formed on the surfaces of the regions 2304 and 2306 and then silicon oxynitride films are formed on the silicon oxide films. Thus, the insulating films 2332 and 2334 are each formed to have a stacked structure of the silicon oxide film and the silicon oxynitride film. In addition, it is also possible to conduct the steps of forming silicon oxide films on the surfaces of the regions 2304 and 2306 by a thermal oxidation method, and then applying high-density-plasma oxidation or nitridation treatment to the silicon oxide films.

The insulating films 2332 and 2334 formed over the regions 2304 and 2306 of the semiconductor substrate 2300 function as the gate insulating films of transistors which are completed later.

Figure 14C:
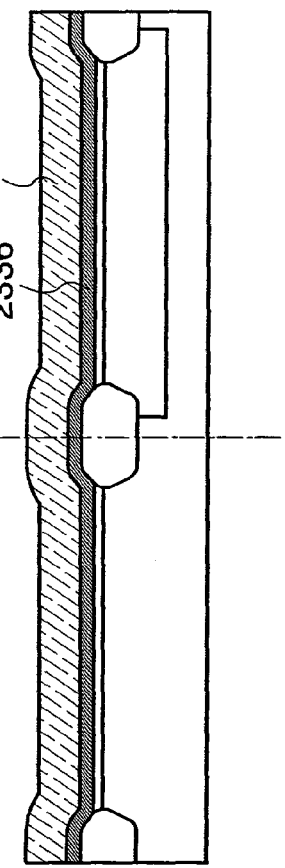

Next, a conductive film is formed so as to cover the insulating films 2332 and 2334 which are formed over the regions 2304 and 2306 (see FIG. 14C). Here, an example is shown where conductive films 2336 and 2338 are sequentially stacked as the conductive film. Needless to say, the conductive film may be formed to have a single layer or a stacked structure of more than two layers.

As a material of the conductive films 2336 and 2338, an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component can be used. Alternatively, a metal nitride film obtained by nitriding the above element can also be used. Further, a semiconductor material typified by polycrystalline silicon doped with an impurity element such as phosphorus can also be used.

Here, a stacked structure is employed in which the conductive film 2336 is formed using tantalum nitride and the conductive film 2338 is formed thereover using tungsten. Alternatively, it is also possible to form the conductive film 2336 using a single-layer film or a stacked film of tungsten nitride, molybdenum nitride, and/or titanium nitride and form the conductive film 2338 using a single-layer film or a stacked film of tantalum, molybdenum, and/or titanium.

Next, the stacked conductive films 2336 and 2338 are selectively removed by etching, so that the conductive films 2336 and 2338 partially remain above the regions 2304 and 2306, respectively. Thus, gate electrodes 2340 and 2342 are formed (see FIG. 15A).

Figure 15A:
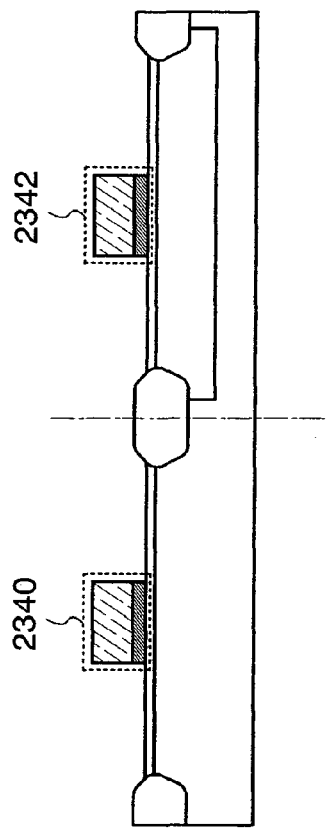
FIGS. 15A to 15C are diagrams illustrating a structure of Embodiment 4 using the present invention.
Figure 15B:
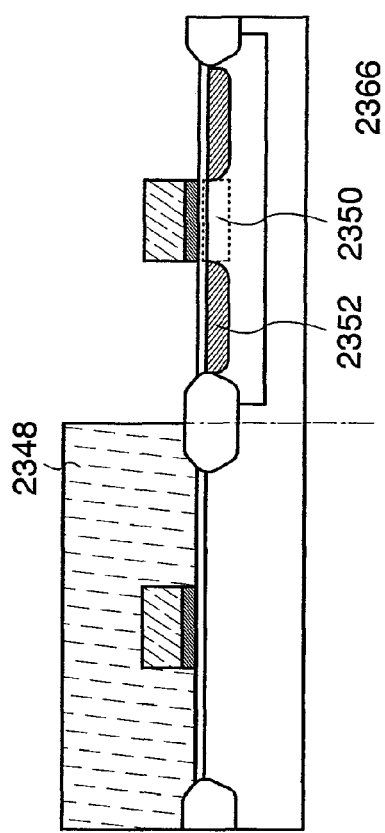

Next, a resist mask 2348 is selectively formed so as to cover the region 2304, and the region 2306 is doped with an impurity element using the resist mask 2348 and the gate electrode 2342 as masks, whereby impurity regions are formed (see FIG. 15B). As an impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used as the impurity element.

In FIG. 15B, with the impurity element introduced, impurity regions 2352 which form source and drain regions and a channel formation region 2350 are formed in the region 2306.

Figure 15C:
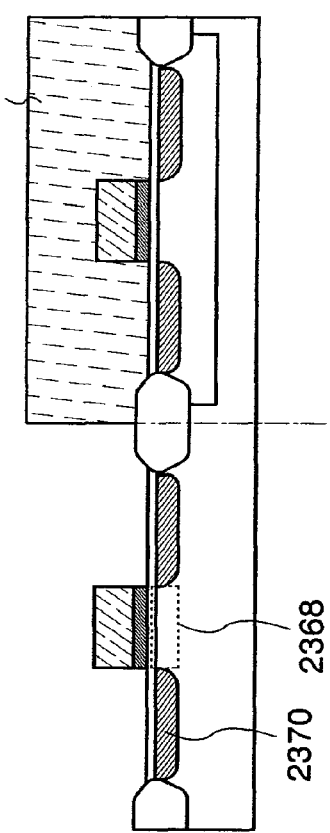
Figure 16:
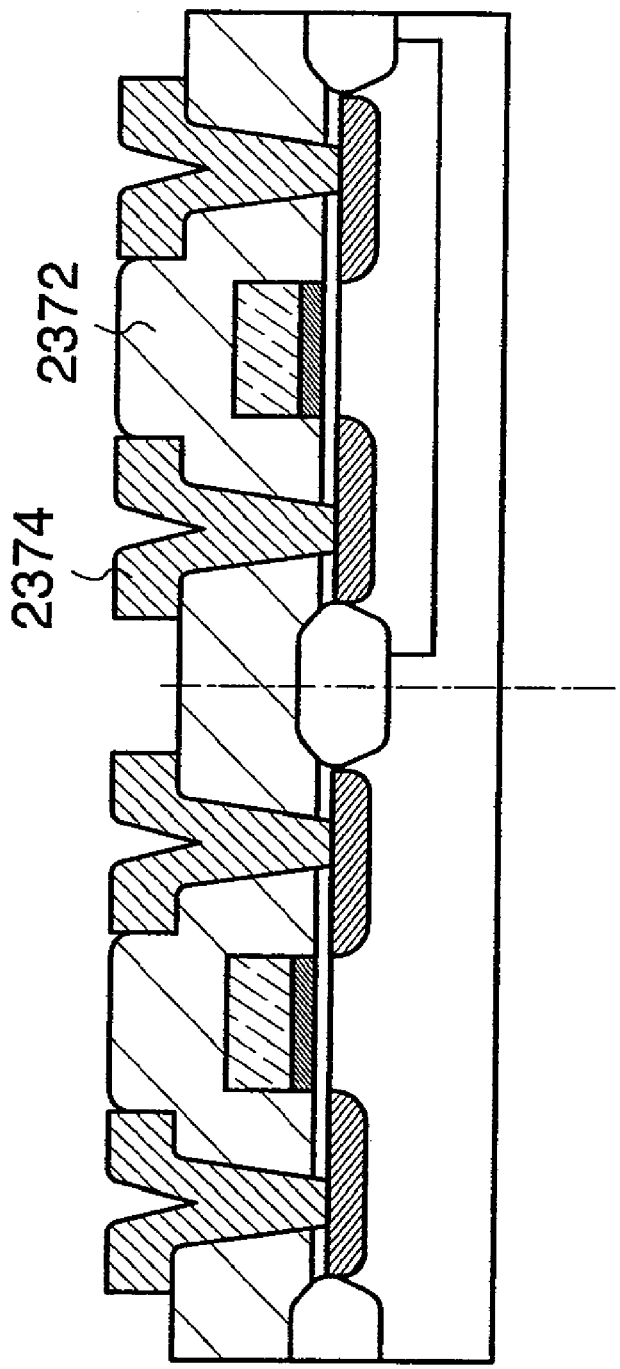
FIG. 16 is a diagram illustrating a structure of Embodiment 4 using the present invention.

Next, a resist mask 2366 is selectively formed so as to cover the region 2306, and the region 2304 is doped with an impurity element using the resist mask 2366 and the gate electrode 2340 as masks, whereby impurity regions are formed (see FIG. 15C). As the impurity element, an n-type impurity region or a p-type impurity region is used. As an n-type impurity element, phosphorus (P), arsenic (As), or the like can be used. As a p-type impurity element, boron (B), aluminum (Al), gallium (Ga), or the like can be used. Here, an impurity element (e.g., boron (B)) of a conductivity type opposite to that of the impurity element which has been introduced into the region 2306 in FIG. 15B is used. As a result, impurity regions 2370 which form source and drain regions and a channel formation region 2368 are formed in the region 2304.

Next, a second insulating film 2372 is formed so as to cover the insulating films 2332 and 2334 and the gate electrodes 2340 and 2342. Then, wirings 2374, which are electrically connected to the impurity regions 2352 and 2370 formed in the regions 2340 and 2360, are formed over the second insulating film 2372 (see FIG. 16A).

The second insulating film 2372 can be formed either in a single layer or in stacked layers, using an insulating film containing oxygen or nitrogen such as silicon oxide ($SiO_x$), silicon nitride ($SiN_x$), silicon oxynitride ($SiO_xN_y$ where $x>y>0$), or silicon nitride oxide ($SiN_xO_y$ where $x>y>0$); a film containing carbon such as DLC (Diamond-Like Carbon); an organic material such as epoxy, polyimide, polyamide, polyvinyl phenol, benzocyclobutene, or acrylic; a siloxane material containing a siloxane resin; or the like. Note that a siloxane material corresponds to a material having the bond of Si—O—Si. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used.

The wirings 2374 are formed either in a single layer or stacked layers of an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as a main component. An alloy material containing aluminum as a main component corresponds to, for example, a material which contains aluminum as a main component and also contains nickel, or a material which contains aluminum as a main component and also contains nickel and one or both of carbon and silicon. The wirings 2374 are preferably formed to have a stacked structure of a barrier film, an aluminum-silicon (Al—Si) film, and a barrier film or a stacked structure of a barrier film, an aluminum silicon (Al—Si) film, a titanium nitride (TiN) film, and a barrier film. Note that "barrier film" corresponds to a thin film made of titanium, titanium nitride, molybdenum, or molybdenum nitride. Aluminum and aluminum silicon, which have high resistance values and are inexpensive, are the most suitable material for forming the wirings 2374. When barrier layers are provided in the top layer and the bottom layer, generation of hillocks of aluminum or aluminum silicon can be prevented. When a barrier film made of titanium which is an element having a high reducing property is formed, even when there is a thin natural oxide film formed on the crystalline semiconductor film, the natural oxide film can be chemically reduced, and a favorable contact between the wirings 2374 and the crystalline semiconductor film can be obtained.

Note that the structure of the semiconductor device of the invention is not limited to the one shown in the drawings. For example, a transistor with an inversely staggered structure, a fin FET structure, or the like can be used. A fin FET structure is advantageous in that it can suppress a short channel effect which would occur with the reduction of transistor size.

Note that this embodiment can be implemented in combination with any of other embodiment modes and other embodiments as appropriate. Specifically, regarding a memory mounted on a semiconductor device, bit lines can be selectively precharged. Accordingly, bit lines which are not associated with reading of data from a memory are not precharged; thus, a semiconductor device equipped with a semiconductor device can be provided.

Embodiment 5

In this embodiment, a method of manufacturing a wireless chip different from that of the above embodiments will be described. A transistor of the present invention can be a MOS transistor provided by a manufacturing method different from the MOS transistor on the single crystalline substrate, which is described in the above embodiment.

In this embodiment, P-channel TFTs (hereinafter also referred to as Pch-TFT) and N-channel TFTs (hereinafter also referred to as Nch-TFT) for forming an inverter and the like are typically shown as a circuit forming the wireless chip. A method of manufacturing a wireless chip will be explained below with reference to cross-sectional views shown in FIG. 17A to FIG. 20B.

First, an insulating film is formed over a substrate 2600. Here, a single-crystalline Si having n-type conductivity is used as the substrate 2600, and insulating films 2602 and 2604 are formed over the substrate 2600 (see FIG. 17A). For example, silicon oxide ($SiO_x$) is formed as the insulating film 2602 by applying thermal treatment to the substrate 2600, and then silicon nitride ($SiN_x$) is formed over the insulating film 2602 by a CVD method.

Any substrate can be used as the substrate 2600 as long as it is a semiconductor. For example, a single-crystalline Si substrate having n-type or p-type conductivity, a compound semiconductor substrate (e.g., a GaAs substrate, an InP substrate, a GaN substrate, a SiC substrate, a sapphire substrate, or a ZnSe substrate), a SOI (Silicon on Insulator) substrate formed by using a bonding method or a SIMOX (Separation by IMplanted OXygen), or the like can be used.

Alternatively, after forming the insulating film 2602, the insulating film 2604 may be formed by nitriding the insulating film 2602 by high-density-plasma treatment. Note that the insulating film provided over the substrate 2600 may have either a single-layer structure or a stacked structure of more than two layers.

Next, patterns of a resist mask 2606 are selectively formed over the insulating film 2604, and selective etching is conducted using the resist mask 2606 as a mask, whereby recessed portions 2608 are selectively formed in the substrate 2600 (see FIG. 17B). For the etching of the substrate 2600 and the insulating films 2602 and 2604, plasma dry etching can be used.

Next, the patterns of the resist mask 2606 are removed, and then an insulating film 2610 is formed so as to cover the recessed portions 2608 formed in the substrate 2600 (see FIG. 17C).

The insulating film 2610 is formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. Here, a silicon oxide film is formed by an atmospheric pressure CVD method or a low-pressure CVD method using a TEOS (tetraethyl orthosilicate) gas.

Next, the surface of the substrate 2600 is exposed by grinding, polishing, or CMP (Chemical Mechanical Polishing). Here, by exposing the surface of the substrate 2600, regions 2612 and 2613 are formed between insulating films 2611 which are formed in the recessed portions 2608 of the substrate 2600. Note that the insulating films 2611 are obtained by partially removing the insulating film 2610 formed over the surface of the substrate 2600 by grinding, polishing, or CMP. Subsequently, by selectively introducing a p-type impurity element, a p-well 2615 is formed in the region 2613 of the substrate 2600 (see FIG. 18A).

As a p-type impurity element, boron (B), aluminum (Al), gallium (Ga), or the like can be used. Here, boron (B) is introduced into the region 2613 as the impurity element.

In this embodiment, although the region 2612 is not doped with an impurity element because an n-type semiconductor substrate is used as the substrate 2600, an n-well may be formed in the region 2612 by introducing an n-type impurity element. As an n-type impurity element, phosphorus (P), arsenic (As), or the like can be used.

When a p-type semiconductor substrate is used, on the other hand, a structure may be used in which the region 2612 is doped with an n-type impurity element to form an n-well, whereas the region 2613 is not doped with an impurity element.

Figure 18A:
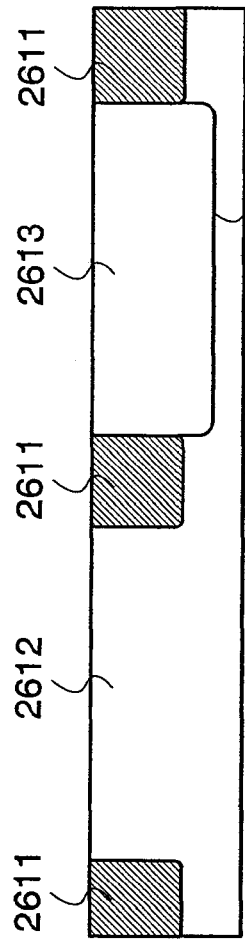
FIGS. 18A to 18C are diagrams illustrating a structure of Embodiment 5 using the present invention.
Figure 18B:
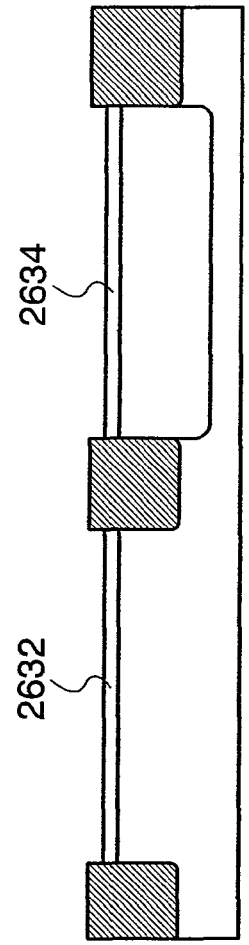

Next, insulating films 2632 and 2634 are formed over the surfaces of the regions 2612 and 2613 in the substrate 2600, respectively (see FIG. 18B).

The insulating films 2632 and 2634 can be formed by, for example, oxidizing the surfaces of the regions 2612 and 2613 provided in the substrate 2600 by thermal treatment. Alternatively, the insulating films 2632 and 2634 can be formed to have a stacked structure of a silicon oxide film and a film containing oxygen and nitrogen (a silicon oxynitride film) by conducting the steps of forming a silicon oxide film by a thermal oxidation method and then nitriding the surface of the silicon oxide film by nitridation treatment.

Further alternatively, the insulating films 2632 and 2634 can be formed by using plasma treatment as described above. For example, the insulating films 2632 and 2634 can be formed using a silicon oxide ($SiO_x$) film or a silicon nitride ($SiN_x$) film which is obtained by applying high-density-plasma oxidation or nitridation treatment to the surfaces of the regions 2612 and 2613 provided in the substrate 2600. Further, after applying high-density-plasma oxidation treatment to the surfaces of the regions 2612 and 2613, high-density-plasma nitridation treatment may be conducted. In that case, silicon oxide films are formed on the surfaces of the regions 2612 and 2613 and then silicon oxynitride films are formed on the silicon oxide films. Thus, the insulating films 2632 and 2634 are each formed to have a stacked structure of the silicon oxide film and the silicon oxynitride film. In addition, it is also possible to conduct the steps of forming silicon oxide films on the surfaces of the regions 2612 and 2613 by a thermal oxidation method, and then applying high-density-plasma oxidation or nitridation treatment to the silicon oxide films.

Note that the insulating films 2632 and 2634 formed in the regions 2612 and 2613 of the substrate 2600 function as the gate insulating films of transistors which are completed later.

Figure 18C:
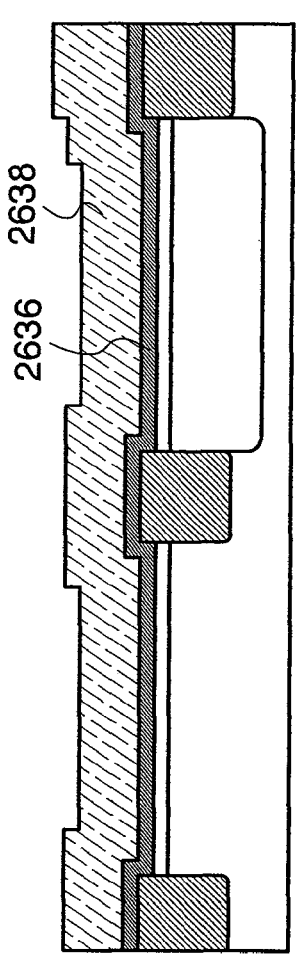

Next, a conductive film is formed so as to cover the insulating films 2632 and 2634 which are formed over the regions 2612 and 2613 provided in the substrate 2600 (see FIG. 18C). Here, an example is shown where conductive films 2636 and 2638 are sequentially stacked as the conductive film. Needless to say, the conductive film may be formed to have a single layer or a stacked structure of more than two layers.

As a material of the conductive films 2636 and 2638, an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component can be used. Alternatively, a metal nitride film obtained by nitriding the above element can also be used. Further, a semiconductor material typified by polycrystalline silicon doped with an impurity element such as phosphorus can also be used.

Here, a stacked structure is employed in which the conductive film 2636 is formed using tantalum nitride and the conductive film 2638 is formed thereover using tungsten. Alternatively, it is also possible to form the conductive film 2636 using a single-layer film or a stacked film of tantalum nitride, tungsten nitride, molybdenum nitride, and/or titanium nitride and form the conductive film 2638 using a single-layer film or a stacked film of tungsten, tantalum, molybdenum, and/or titanium.

Next, the stacked conductive films 2636 and 2638 are selectively removed by etching, so that the conductive films 2636 and 2638 partially remain above the regions 2612 and 2613 of the substrate 2600. Thus, conductive films 2640 and 3642 functioning as gate electrodes are formed (see FIG. 19A). Here, a part of the regions 2612 and 2613 of the substrate 2600 which does not overlap with the conductive films 2640 and 2642 is exposed at its surface.

Specifically, a part of the insulating film 2632 formed over the region 2612 of the substrate 2600, which does not overlap with the conductive film 2640, is selectively removed, so that the ends of the conductive film 2640 and the ends of the insulating film 2632 approximately correspond to each other. In addition, a part of the insulating film 2634 formed over the region 2613 of the substrate 2600, which does not overlap with the conductive film 2642, is selectively removed, so that the ends of the conductive film 2642 and the ends of the insulating film 2634 approximately correspond to each other.

In this case, the part of the insulating films which do not overlap with the conductive films 2640 and 2642 may be removed at the same time as the formation of the conductive films 2640 and 2642. Alternatively, the part of the insulating films which do not overlap with the conductive films 2640 and 2642 may be removed by using resist masks which are left after forming the conductive films 2640 and 2642 as masks, or by using the conductive films 2640 and 2642 as masks.

Then, the regions 2612 and 2613 of the substrate 2600 are selectively doped with an impurity element (see FIG. 19B). Here, the region 2613 is selectively doped with an n-type impurity element at a low concentration, using the conductive film 2642 as a mask, whereas the region 2612 is selectively doped with a p-type impurity element at a low concentration, using the conductive film 2640 as a mask. As an n-type impurity element, phosphorus (P), arsenic (As), or the like can be used. As a p-type impurity element, boron (B), aluminum (Al), gallium (Ga), or the like can be used.

Next, sidewalls 2643 having a contact with the side surfaces of the conductive films 2640 and 2642 are formed. Specifically, a film containing an inorganic material such as silicon, silicon oxide, or silicon nitride, or a film containing an organic material such as an organic resin is formed in a single layer or in stacked layers. Then, the insulating film is selectively etched by anisotropic etching (mainly in the perpendicular direction), so that the sidewalls 2654 can be formed so as to be in contact with the side surfaces of the conductive films 2401 and 2642. The sidewalls 2654 are used as doping masks for forming LDD (Lightly Doped Drain) regions. In addition, the sidewalls 2654 are formed to be in contact with the sides of insulating films and gate electrodes which are formed below the conductive films 2640 and 2642.

Next, by doping the regions 2612 and 2613 of the substrate 2600 with an impurity element, using the sidewalls 2654 and the conductive films 2640 and 2642 as masks, impurity regions which function as source and drain regions are formed (see FIG. 19C). Here, the region 2613 of the substrate 2600 is doped with an n-type impurity element at a high concentration, using the sidewalls 2654 and the conductive film 2642 as masks, whereas the region 2612 is doped with a p-type impurity element at a high concentration, using the sidewalls 2654 and the conductive film 2640 as masks.

As a result, impurity regions 2658 which form source and drain regions, low concentration impurity regions 2660 which form LDD regions, and a channel formation region 2656 are formed in the region 2612 of the substrate 2600. Meanwhile, impurity regions 2664 which form source and drain regions, low concentration impurity regions 2666 which form LDD regions, and a channel formation region 2662 are formed in the region 2613 of the substrate 2600.

Note that in this embodiment, the impurity elements are introduced with the condition that a part of the regions 2612 and 2613 of the substrate 2600 which does overlap with the conductive films 2640 and 2642 is exposed. Accordingly, the channel formation regions 2656 and 2662 which are formed in the regions 2612 and 2613 of the substrate 2600 respectively can be formed in a self-aligned manner with respect to the conductive films 2640 and 2642.

Figure 20A:
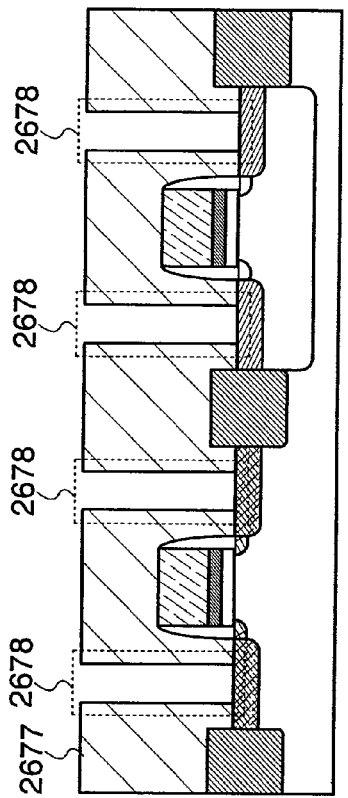
FIGS. 20A and 20B are diagrams illustrating a structure of Embodiment 5 using the present invention.
Figure 20B:
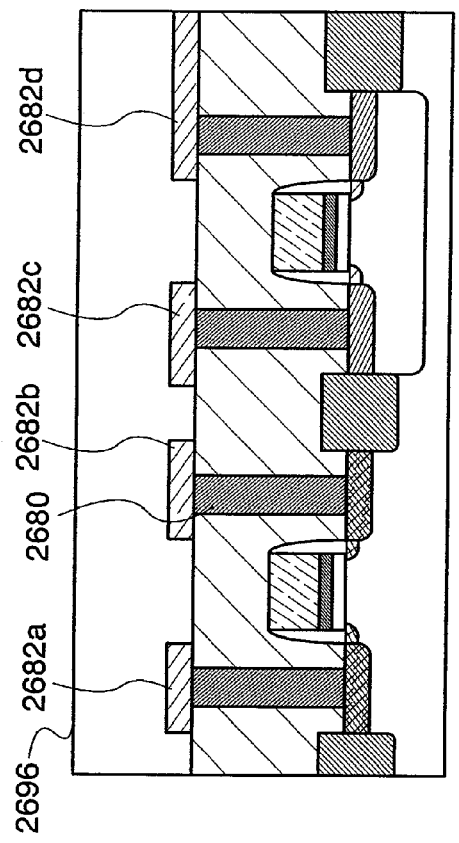
Figure 21A:
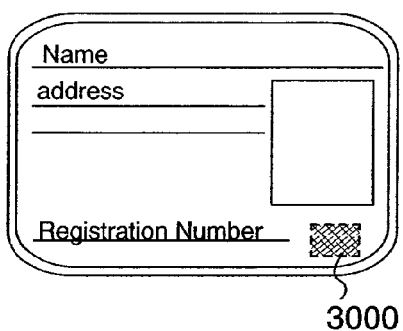
FIGS. 21A to 21F are diagrams illustrating a structure of Embodiment 5 using the present invention.
Figure 21B:
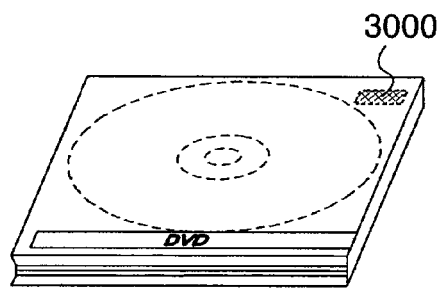
Figure 21C:
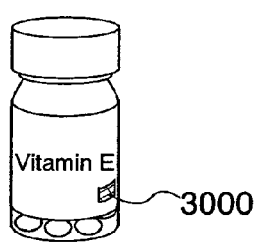
Figure 21D:
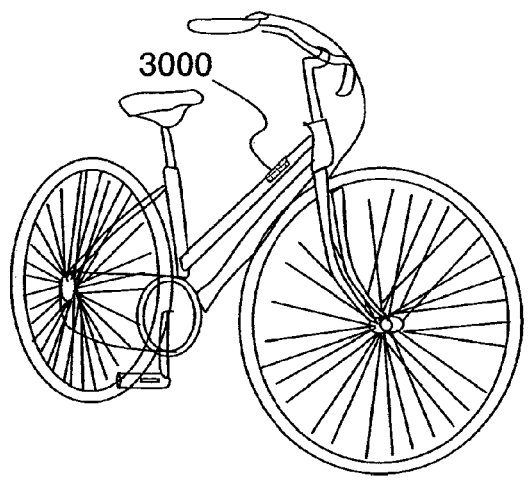
Figure 21E:
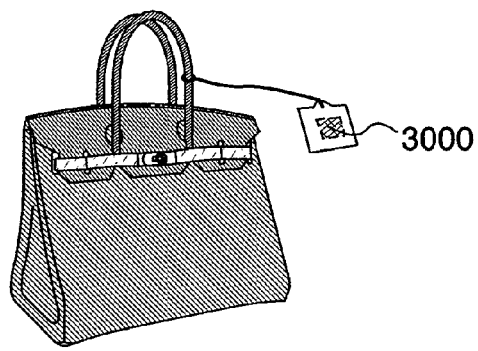
Figure 21F:
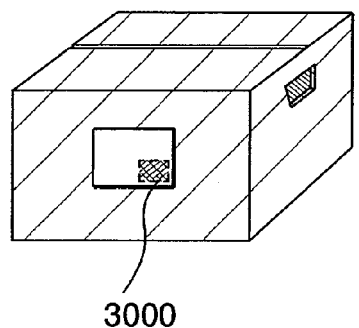

Next, a second insulating film 2677 is formed so as to cover the insulating films, the conductive films, and the like which are provided over the regions 2612 and 2613 of the substrate 2600, and openings 2678 are formed in the second insulating film 2677 (see FIG. 20A).

The second insulating film 2677 can be formed either in a single layer or in stacked layers, using an insulating film containing oxygen or nitrogen such as silicon oxide ($SiO_x$), silicon nitride ($SiN_x$), silicon oxynitride ($SiO_xN_y$, where $x>y>0$), or silicon nitride oxide ($SiN_xO_y$, where $x>y>0$); a film containing carbon such as DLC (Diamond-Like Carbon); an organic material such as epoxy, polyimide, polyamide, polyvinyl phenol, benzocyclobutene, or acrylic; a siloxane material containing a siloxane resin; or the like. Note that a siloxane material corresponds to a material having the bond of Si—O—Si. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent.

Next, conductive films 2680 are formed in the openings 2678 by a CVD method. Then, conductive films 2682a to 2682d are selectively formed over the insulating film 2677 so as to be electrically connected to the conductive films 2680 (see FIG. 20B).

The conductive films 2680 and 2682a to 2682d are formed either in a single layer or stacked layers of an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as a main component. An alloy material containing aluminum as a main component corresponds to, for example, a material which contains aluminum as a main component and also contains nickel, or a material which contains aluminum as a main component and also contains nickel and one or both of carbon and silicon. Each of the conductive films 2680 and 2682 to 2682*d* is preferably formed to have a stacked structure of a barrier film, an aluminum-silicon (Al—Si) film, and a barrier film or a stacked structure of a barrier film, an aluminum silicon (Al—Si) film, a titanium nitride (TiN) film, and a barrier film. Note that "barrier film" corresponds to a thin film made of titanium, titanium nitride, molybdenum, or molybdenum nitride. Aluminum and aluminum silicon, which have high resistance values and are inexpensive, are the most suitable material for forming the conductive film 2680. When barrier layers are provided in the top layer and the bottom layer, generation of hillocks of aluminum or aluminum silicon can be prevented. When a barrier film made of titanium which is an element having a high reducing property is formed, even when there is a thin natural oxide film formed on the crystalline semiconductor film, the natural oxide film can be chemically reduced, and a favorable contact between the conductive film 2680 and the crystalline semiconductor film can be obtained. Here, the conductive film 2680 can be formed by selectively growing tungsten (W) by a CVD method.

Through the above steps, a semiconductor device provided with a P-channel transistor formed in the region 2612 of the substrate 2600 and an N-channel transistor formed in the region 2613 of the substrate 2600 can be obtained.

Note that the structure of the transistor forming the semiconductor device of the invention is not limited to the one shown in the drawings. For example, a transistor with an inversely staggered structure, a fin FET structure, or the like can be used. A fin FET structure is advantageous in that it can suppress a short channel effect which would occur with the reduction of transistor size.

Note that this embodiment can be implemented in combination with any of other embodiment modes and other embodiments as appropriate. Specifically, regarding a memory mounted on a semiconductor device, bit lines can be selectively precharged. Accordingly, bit lines which are not associated with reading of data from a memory are not precharged; thus, a semiconductor device equipped with a semiconductor device can be provided.

Embodiment 6

With reference to FIGS. 21A to 21F, use of a semiconductor device 3000 that functions as the wireless chip described in the above embodiment is described.

A wireless chip can be applied to a wide range of purposes. For example, the wireless chip can be attached to bank notes, coins, documents of value, bearer bonds, identification certificates (such as a driver's license or a residence card, refer to FIG. 21A), pack cases (such as package paper or a bottle, refer to FIG. 21C), recording media (such as DVD software or a video tape, refer to FIG. 21B), vehicles (such as a bicycle, refer to FIG. 21D), personal belongings (such as a bag or glasses), foods, plants, animals, human bodies, clothes, general merchandise, products such as electronic appliances, luggage tags (refer to FIGS. 21E and 21F), and the like. The electronic appliances include a liquid crystal display device, an EL display device, a television device (also referred to as a TV, a TV receiver, or a television receiver), a mobile phone, and the like.

The semiconductor device 3000 of the present invention is fixed to a product by mounting the device onto the product, attaching the device to a surface of the product, or embedding the device inside the product. For example, if the product is a book, the device is embedded inside paper and if the product is a package made of an organic resin, the device is embedded is inside the organic resin; thus, the device is fixed to each product. Since the semiconductor device 3000 of the present invention can be compact, thin, and lightweight, it does not degrade the quality of design even after the device is fixed to a product. When the semiconductor device 3000 of the present invention is provided to bank notes, coins, documents of value, bearer bonds, identification certificates, and the like, an authentication function can be provided. With the use of this authentication function, the forgery can be prevented. Further, when the semiconductor device 3000 of the present invention is attached to pack cases, recording media, personal belongings, foods, clothes, general merchandise, electronic appliances, and the like, systems such as an inspection system can be made efficient.

Note that this embodiment can be implemented in combination with any of other embodiment modes and other embodiments as appropriate. Specifically, regarding a memory mounted on a semiconductor device, bit lines can be selectively precharged. Accordingly, bit lines which are not associated with reading of data from a memory are not precharged; thus, a semiconductor device equipped with a semiconductor device can be provided.

This application is based on Japanese Patent Application serial no. 2005-307906 filed in Japan Patent Office on Jun. 30 in 2006, the entire contents of which are hereby incorporated by reference.

What is claimed is:

1. A semiconductor device comprising:
   a word line;
   a first bit line and a second bit line;
   a first memory cell electrically connected to the word line and the first bit line;
   a second memory cell electrically connected to the word line and the second bit line;
   a first switching element including a first terminal electrically connected to the first bit line;
   a second switching element including a first terminal electrically connected to the second bit line;
   a first precharge circuit configured to output a precharge potential to the first bit line, wherein the first precharge circuit is electrically connected to the first bit line through the first switching element;
   a second precharge circuit configured to output a precharge potential to the second bit line, wherein the second precharge circuit is electrically connected to the second bit line through the second switching element; and
   a circuit configured to operate the first switching element and the second switching element selectively.

2. A semiconductor device according to claim 1,
   wherein the first precharge circuit includes a first transistor, the second precharge circuit includes a second transistor,
   one of a source and a drain of the first transistor is electrically connected to a second terminal of the first switching element, and
   one of a source and a drain of the second transistor is electrically connected to a second terminal of the second switching element.

3. A semiconductor device according to claim 1,
wherein the first memory cell includes a first transistor,
the second memory cell includes a second transistor,
a gate of the first transistor is electrically connected to the word line, and one of a source and a drain of the first transistor is electrically connected to the first bit line, and
a gate of the second transistor is electrically connected to the word line, and one of a source and a drain of the second transistor is electrically connected to the second bit line.

4. A semiconductor device according to claim 2, wherein the first transistor and the second transistor are both provided on a substrate, and wherein the substrate is any one of a glass substrate, a quartz substrate, and a plastic substrate.

5. A semiconductor device according to claim 2, wherein the first transistor and the second transistor are formed on an SOI substrate.

6. A semiconductor device according to claim 1, wherein:
the first bit line is electrically connected to a first latch circuit configured to store an electric potential for reading data stored in the first memory cell; and
the second bit line is electrically connected to a second latch circuit configured to store an electric potential for reading data stored in the second memory cell.

7. An electronic device including a semiconductor device according to claim 1.

8. The semiconductor device of claim 1 wherein to operate the first switching element and the second switching element selectively, the circuit is configured to apply a signal to the first switching element without applying the signal to the second switching element.

9. The semiconductor device of claim 1 wherein to operate the first switching element and the second switching element selectively, the circuit is configured to concurrently apply a first signal to a third terminal of the first switching element and a second signal to a third terminal of the second switching element.

10. The semiconductor device of claim 1 wherein the first precharge circuit is configured to be operated with a read signal line electrically connected to a first terminal of the first precharge circuit, wherein the read signal line is not electrically connected to either the first or second switching elements.

11. A semiconductor device comprising:
a modulating circuit;
a demodulating circuit;
an antenna;
a logic circuit; and
a memory circuit including:
a word line,
a first bit line and a second bit line,
a first memory cell electrically connected to the word line and the first bit line,
a second memory cell electrically connected to the word line and the second bit line,
a first switching element including a first terminal electrically connected to the first bit line,
a second switching element including a first terminal electrically connected to the second bit line,
a first precharge circuit configured to output a precharge potential to the first bit line, wherein the first precharge circuit is electrically connected to the first bit line through the first switching element,
a second precharge circuit configured to output a precharge potential to the second bit line, wherein the second precharge circuit is electrically connected to the second bit line through the second switching element, and
a circuit configured to operate the first switching element and the second switching element selectively.

12. A semiconductor device according to claim 11, wherein:
the first precharge circuit includes a first transistor,
the second precharge circuit includes a second transistor,
one of a source and a drain of the first transistor is electrically connected to a second terminal of the first switching element, and
one of a source and a drain of the second transistor is electrically connected to a second terminal of the second switching element.

13. A semiconductor device according to claim 12, wherein the first transistor and the second transistor are both provided on a substrate, and wherein the substrate is any one of a glass substrate, a quartz substrate, and a plastic substrate.

14. A semiconductor device according to claim 12, wherein the first transistor and the second transistor are formed on an SOI substrate.

15. A semiconductor device according to claim 11, wherein the first memory cell includes a first transistor, the second memory cell includes a second transistor,
a gate of the first transistor is electrically connected to the word line, and one of a source and a drain of the first transistor is electrically connected to the first bit line, and
a gate of the second transistor is electrically connected to the word line, and one of a source and a drain of the second transistor is electrically connected to the second bit line.

16. A semiconductor device according to claim 11, wherein:
the first bit line is electrically connected to a first latch circuit configured to store an electric potential for reading data stored in the first memory cell; and
the second bit line is electrically connected to a second latch circuit configured to store an electric potential for reading data stored in the second memory cell.

17. An electronic device including a semiconductor device according to claim 11.

18. The semiconductor device of claim 11 wherein to operate the first switching element and the second switching element selectively, the circuit is configured to apply a signal to the first switching element without applying the signal to the second switching element.

19. The semiconductor device of claim 11 wherein to operate the first switching element and the second switching element selectively, the circuit is configured to concurrently apply a first signal to a third terminal of the first switching element and a second signal to a third terminal of the second switching element.

20. The semiconductor device of claim 11 wherein the first precharge circuit is configured to be operated with a read signal line electrically connected to a first terminal of the first precharge circuit, wherein the read signal line is not electrically connected to either the first or second switching elements.

* * * * *

UNITED STATES PATENT AND TRADEMARK OFFICE
CERTIFICATE OF CORRECTION

PATENT NO. : 7,742,351 B2 Page 1 of 1
APPLICATION NO. : 11/762146
DATED : June 22, 2010
INVENTOR(S) : Takayuki Inoue, Yoshiyuki Kurokawa and Takayuki Ikeda It is certified that error appears in the above-identified patent and that said Letters Patent is hereby corrected as shown below:

Column 33, line 25, replace "tbereover" with --thereover--.

Signed and Sealed this

Nineteenth Day of October, 2010

David J. Kappos
*Director of the United States Patent and Trademark Office*